United States Patent
Uchino et al.

(10) Patent No.: US 6,509,728 B1
(45) Date of Patent: Jan. 21, 2003

(54) SPECTRUM ANALYZER HAVING FUNCTION OF DISPLAYING AMPLITUDE PROBABILITY DISTRIBUTION EFFECTIVELY

(75) Inventors: Masaharu Uchino, Aikawa-machi (JP); Takashi Shinozuka, Sendai (JP); Haruhiko Hosoya, Atsugi (JP)

(73) Assignees: Anritsu Corporation, Tokyo (JP); Electromagnetic Compatibility Research Laboratories Co., Ltd., Sendai (JP)

( * ) Notice: Subject to any disclaimer, the term of this patent is extended or adjusted under 35 U.S.C. 154(b) by 0 days.

(21) Appl. No.: 09/314,346

(22) Filed: May 19, 1999

(30) Foreign Application Priority Data

May 28, 1998 (JP) .......................... 10-164261
Mar. 17, 1999 (JP) .......................... 11-072251

(51) Int. Cl.[7] ............................. G01R 23/16
(52) U.S. Cl. ................. 324/76.15; 324/76.13
(58) Field of Search .................. 324/76.15, 76.24, 324/76.12, 76.13, 76.22, 76.21

(56) References Cited

U.S. PATENT DOCUMENTS 3,581,200 A * 5/1971 Mifflin ................ 324/103 P
3,626,168 A * 12/1971 Norsworthy ............. 324/76.13
4,354,177 A * 10/1982 Sloane ........................ 341/120
H1458 H * 7/1995 Slack ...................... 324/76.13
5,490,172 A * 2/1996 Komara ....................... 375/296

FOREIGN PATENT DOCUMENTS

JP    10-170574    6/1998

* cited by examiner

Primary Examiner—N. Le
Assistant Examiner—Vincent Q. Nguyen
(74) Attorney, Agent, or Firm—Frishauf, Holtz, Goodman & Chick, P.C.

(57) ABSTRACT

A spectrum analyzer including a signal receiving and processing unit, a sampling unit, a histogram measuring unit, an arithmetic unit and a display unit. The signal receiving and processing unit receives an input signal according to the desired frequency sweep information. The sampling unit samples a signal output from receiving and processing unit, according to a plurality of threshold values and outputs a plurality of output codes corresponding to sample values of the envelope of the input signal. The histogram measuring unit measures a group of histograms corresponding to the output codes produced by the sampling unit. The arithmetic unit calculates the amplitude probability distribution (APD) of the output signal based on the histograms. The display unit displays a band group having a plurality of the ranges calculated by the arithmetic unit as an area in different states.

16 Claims, 25 Drawing Sheets

$fRF = fIF \pm fL1 \pm fL2$

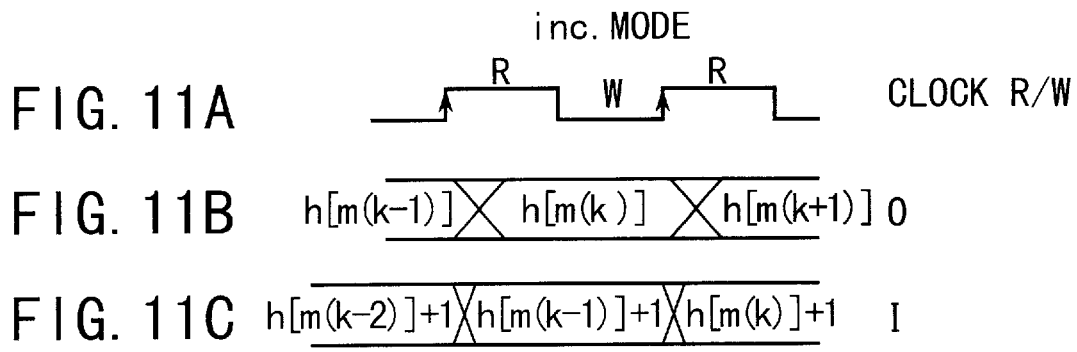
FIG. 11A
FIG. 11B
FIG. 11C
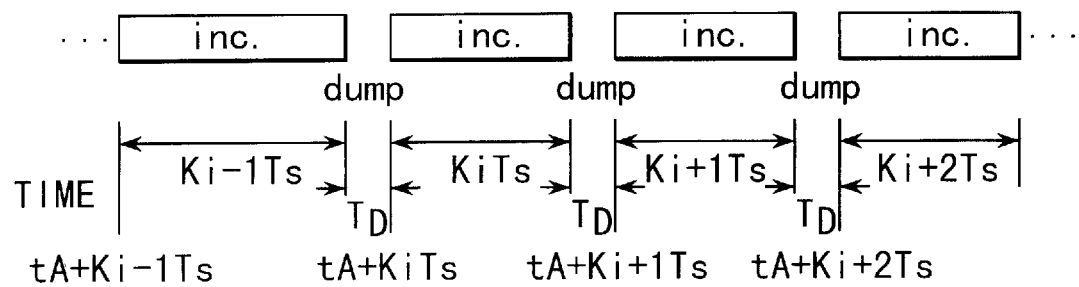
FIG. 12
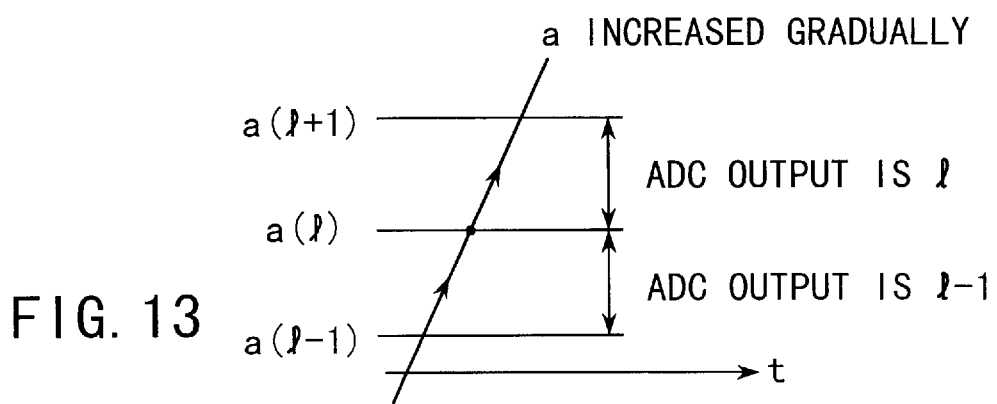
FIG. 13

| NUMBER F OF PULSES | OUTPUT d0 | d1 | d2 | d3 | d4 | d5 | d6 |
|---|---|---|---|---|---|---|---|
| 0 | 1 | 1 | 1 | 1 | 1 | 1 | 1 |
| 1 | 0 | 1 | 1 | 1 | 1 | 1 | 1 |
| 2 | 0 | 0 | 1 | 1 | 1 | 1 | 1 |
| 3 | 0 | 0 | 0 | 1 | 1 | 1 | 1 |
| 4 | 0 | 0 | 0 | 0 | 1 | 1 | 1 |
| 5 | 0 | 0 | 0 | 0 | 0 | 1 | 1 |
| 6 | 0 | 0 | 0 | 0 | 0 | 0 | 1 |
| 7 | 1 | 0 | 0 | 0 | 0 | 0 | 0 |
| 8 | 0 | 1 | 0 | 0 | 0 | 0 | 0 |
| ⋮ | ⋮ | | | ⋮ | | | |
| 125 | 1 | 1 | 1 | 1 | 1 | 0 | 1 |
| 126 | 1 | 1 | 1 | 1 | 1 | 1 | 0 |

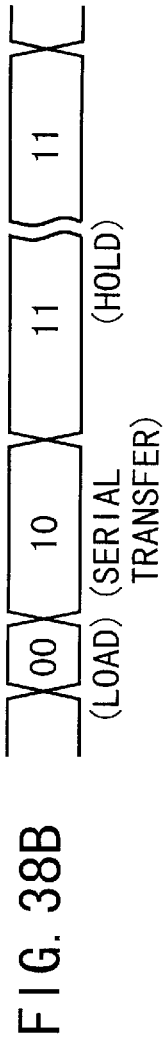
FIG. 38A
FIG. 38B
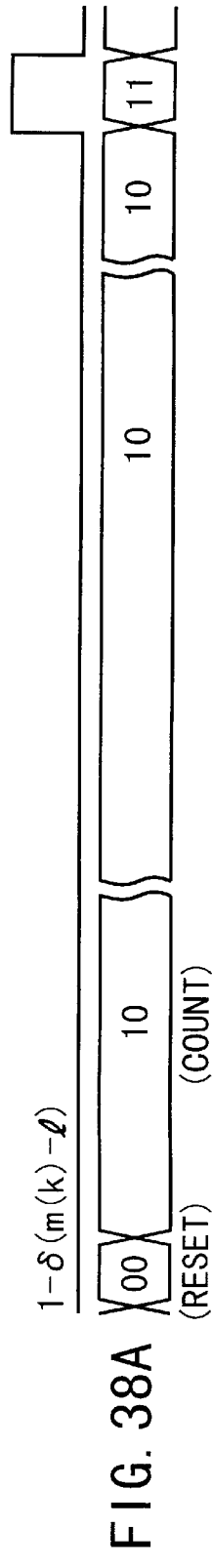
FIG. 39A
FIG. 39B
FIG. 39C
FIG. 39D

SPECTRUM ANALYZER HAVING FUNCTION OF DISPLAYING AMPLITUDE PROBABILITY DISTRIBUTION EFFECTIVELY

BACKGROUND OF THE INVENTION

The present invention relates to a spectrum analyzer, or more in particular, to a spectrum analyzer having the function of effectively displaying the amplitude probability distribution (hereinafter sometimes referred to as the APD) of the signal field strength of a disturbance or the like, that is, the time ratio at which the level of the envelope of the signal such as a disturbance exceeds a preset threshold level, as a measure for statistically evaluating an electromagnetic environment.

In recent years, the digital communication and the digital broadcasting using such means as the portable telephone and the personal handy phone (PHS) operating in a frequency band higher than 1 GHz have extended more than ever before.

In order to protect these radio communications from disturbance, a method of measuring the disturbance and the limits thereof are under study at the International Special Committee on Radio Disturbance (CISPR).

At present, the limit of the frequency band of not higher than 1 GHz is specified primarily by the quasi peak value (QP value) of the disturbance.

This is by reason of the fact that the QP value of the disturbance is correlated with the degree of the interference in the analog communication.

It is, however, difficult to consider that the QP value of the disturbance or the peak value now being studied by CISPR, etc. as a limit in the frequency band not lower than 1 GHz is correlated with the degree of interference in the digital communication or the digital broadcasting.

For the digital communication and the digital broadcasting expected to be used more and more in the frequency band not lower than 1 GHz to be protected from the disturbance, it is desirable to determine the limit of the frequency band not lower than 1 GHz as an index correlated with the degree of interference in the digital system.

On the other hand, the communication quality of the digital communication line is expressed by a bit error rate (BER). It has been reported that the deterioration of the BER of the digital line caused by the disturbance can be estimated from the APD.

Therefore, the APD of the disturbance strength, if it can be measured accurately in simplistic fashion, is considered to provide the optimal index for evaluating the interference in the digital communication.

The apparatus for measuring the APD of the electrical signal has a long history and has hitherto been used primarily for measuring the atmospherics.

With the progress of the technologies, the APD measuring circuit has come to be configured of semiconductors and the operating speed thereof has increased. The conventional APD measuring circuit 121, however, requires as many comparators and counters as the number of the levels for determining the amplitude resolution.

For improving the amplitude resolution, therefore, it is necessary to add as many comparators and counters as the number of levels. Thus, the APD measuring apparatus of high resolution is expensive and is not suitably used widely to measure EMI.

A spectrum analyzer is also known conventionally as a disturbance field strength measuring apparatus for statistically evaluating an electromagnetic environment.

FIG. 44 is a block diagram showing a general configuration of a spectrum analyzer of this type constituting a disturbance field strength measuring apparatus for statistically evaluating the electromagnetic environment.

Specifically, as shown in FIG. 44, the spectrum analyzer comprises a front end 101, a bandpass filter (BPF) 102, a log video amplifier (LVA) 103, a peak detection circuit 104, a bottom detection circuit 105, an arithmetic unit 106 and a display unit 107.

The front end 101 is a radio wave receiving circuit including a frequency converter having a local oscillator and a mixer for producing an intermediate frequency signal (IF).

As a result, the radio disturbance or the like received through an antenna (not shown) is output from the front end 101 as an IF signal component, and then supplied to the peak detection circuit 104 and the bottom detection circuit 105 through the BPF 102 and the LVA 103.

The peak detection circuit 104 and the bottom detection circuit 105 detect the peak value and the bottom value of the envelope component of the IF signal based on the output of the LVA 103.

Specifically, let P(t) be the output signal of the LVA 103. Then, during the measurement time $(T_i \leq t < t_i + T)$, the peak value $P_p(t_i)$ and the bottom value $P_b(t_i)$ are supplied to the arithmetic unit 106 in the form of $$P_p(t_i) = \max P(t)$$

$$P_b(t_i) = \min P(t) \qquad (1)$$

In the arithmetic unit 106, the peak value $P_p$ ($t_i$) and the bottom value $P_b$ ($t_i$) for the envelope component of the disturbance or the like supplied as described above and the front end state number or a trigger signal from the front end 101 are arithmetically processed in a predetermined manner for display on the display unit 107.

FIG. 45 shows an example display on the display unit 107 of the spectrum analyzer described above.

Specifically, as shown in FIG. 45, the display unit 107 displays the peak value $P_p$ ($t_i$) and the bottom value $P_b$ ($t_i$) in the envelope component of the disturbance or the like from the arithmetic unit 106 on the frequency axis by changing the value i sequentially in the order of 0, 1, 2, . . . , $N_w - 1$ ($N_w$: resolution in frequency domain).

In this case, $f_c$ on the frequency axis designates the center frequency, $f_1$ the start frequency and $f_2$ the stop frequency in the measurement range (span).

As a result, the peak value $P_p$ ($t_i$) and the bottom value $P_b$ ($t_i$) of the radio disturbance expressed as $$f_{RF}(i) = f_1 + \{(f_2 - f_1) i / N_w\} \qquad (2)$$

received during the measurement time $(t_i \leq t < t_i + T)$ are read from FIG. 45 in the form analyzed on the frequency axis.

The area of P indicated by $P_p$ ($t_i$)>P>$P_b$ is shown by hatching so that the amount between the peak value $P_p$ ($t_i$) and the bottom value $P_b$ ($t_i$) is easily identified.

In the disturbance measuring apparatus using the spectrum analyzer described above, however, the APD is not displayed based on the output signal P(t) of the LVA 103 during the measuring time $(t_i \leq t < t_i + T)$ constituting an important factor for statistically evaluating the electromagnetic environment, and therefore nothing can be understood of the APD.

Displaying the APD by the contour display method is another alternative conceivable. This method poses the problem, however, that as explained in detail later in comparison with the area identification display method according to this invention, the distribution with a correct threshold value contour cannot be easily identified in the case where contours of different threshold values are superposed one on the other.

BRIEF SUMMARY OF THE INVENTION

An object of the present invention is to provide a spectrum analyzer having the function of effectively displaying the APD by solving the problem of the prior art described above, by employing the area identification display method using a band group having a plurality of ranges such as different color bands, for example.

Another object of the present invention is to solve the problem of the prior art described above and to provide an APD display method with a spectrum analyzer effectively capable of APD by the area identification display method using a band group having a plurality of ranges such as different color bands.

In order to achieve the above-mentioned objects, according to an embodiment of the invention, there is provided a spectrum analyzer having the APD display function, comprising:

signal receiving and processing means for receiving an input signal in accordance with desired frequency sweep information;

sampling means for sampling an output signal output from the signal receiving and processing means, based on a plurality of threshold values and outputting a plurality of output codes corresponding to sample value of the envelope of the input signal;

histogram measuring means for measuring a histogram group corresponding to the output codes produced from the sampling means;

arithmetic means for calculating an amplitude probability distribution (APD) of the output signal based on the histogram group measured by the histogram measuring means and the desired frequency sweep information and classifying the amplitude probability distribution into a group of bands having a plurality of ranges corresponding to the histogram group; and display means for displaying the band group having a plurality of the ranges calculated by the arithmetic means as areas to be displayed in different states;

In order to achieve the objects described above, according to another aspect of the invention, there is provided an APD display method with a spectrum analyzer, comprising the steps of:

receiving an input signal in accordance with desired sweep information;

outputting a plurality of output codes corresponding to the sample values of the envelope of the input signal by sampling an output signal based on the input signal according to a plurality of threshold values;

measuring a group of histograms corresponding to the output codes;

calculating the amplitude probability distribution (APD) of the input signal based on the histogram group and the desired sweep information and classifying the APD into a group of bands having a plurality of ranges corresponding to the histogram group; and displaying the band group having a plurality of the ranges as areas to be displayed in different states, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 11A to 11C are timing charts for explaining the operation of the histogram measuring circuit 206 in FIG. 10;

FIG. 12 is a diagram showing the timing relation between the "inc" mode and the "dump" mode of the RAM 207;

FIG. 13 is a diagram showing the manner in which the output of the ADC 204 is calibrated in advance;

FIGS. 38A and 38B are diagrams for explaining the operation of the circuit shown in FIG. 34;

FIGS. 39A to 39D are diagrams for explaining the operation of the circuit shown in FIG. 34;

DETAILED DESCRIPTION OF THE INVENTION

A spectrum analyzer according to an embodiment of the present invention will be explained below with reference to the accompanying drawings.

Figure 1:
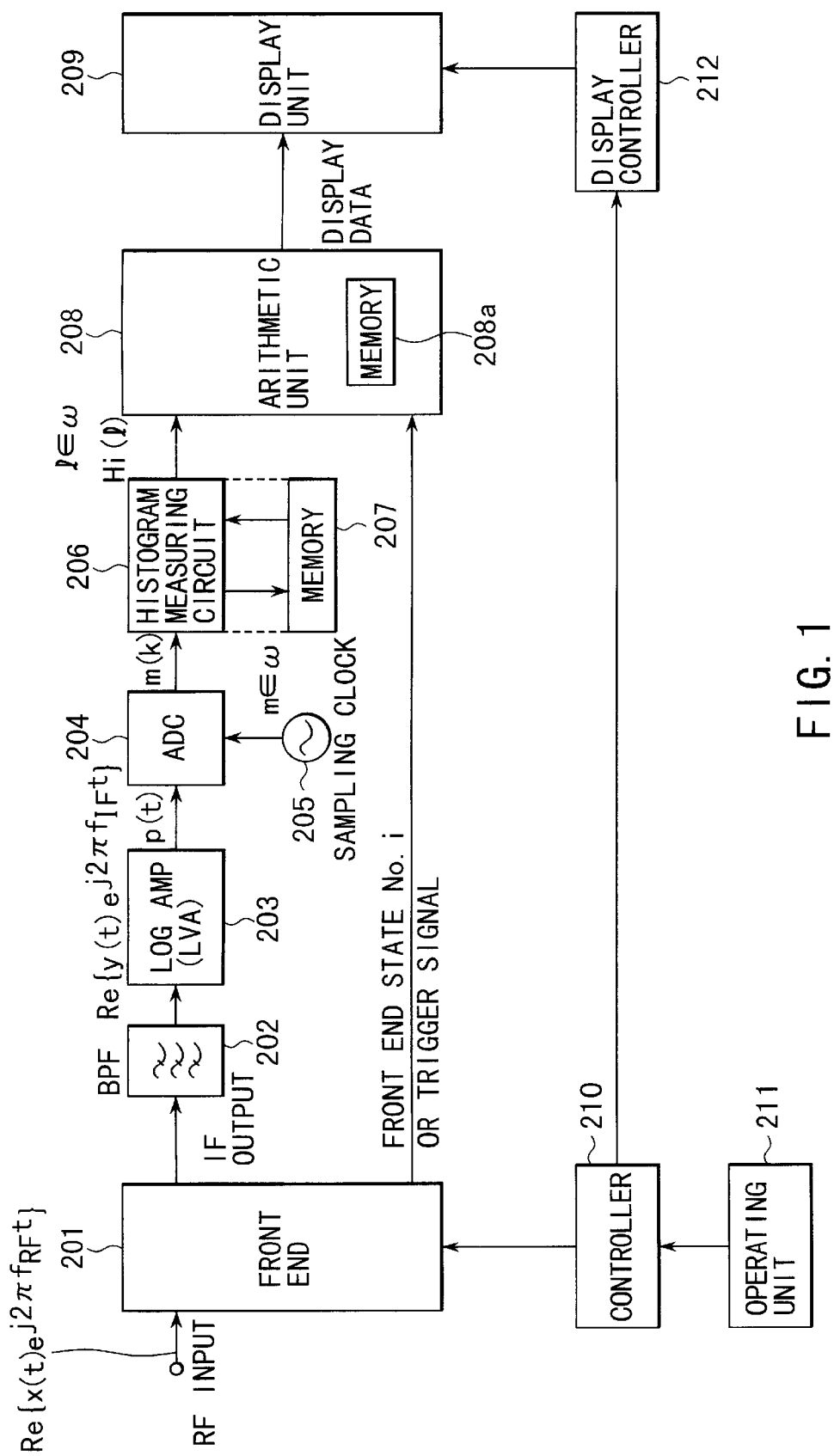
FIG. 1 is a block diagram showing a general configuration of a spectrum analyzer according to an embodiment of the invention.

FIG. 1 is a block diagram schematically showing a general configuration of a spectrum analyzer according to an embodiment of the invention.

Specifically, as shown in FIG. 1, the spectrum analyzer includes a front end 201, a bandpass filter (BPF) 202, a log video amplifier (LVA) 203, an analog-digital converter (ADC) 204, a sampling clock generator 205, a histogram measuring circuit 206 including a memory 207, an arithmetic unit 208, a display unit 209, a controller 210, an operating unit 211 and a display controller 212.

Figure 2:
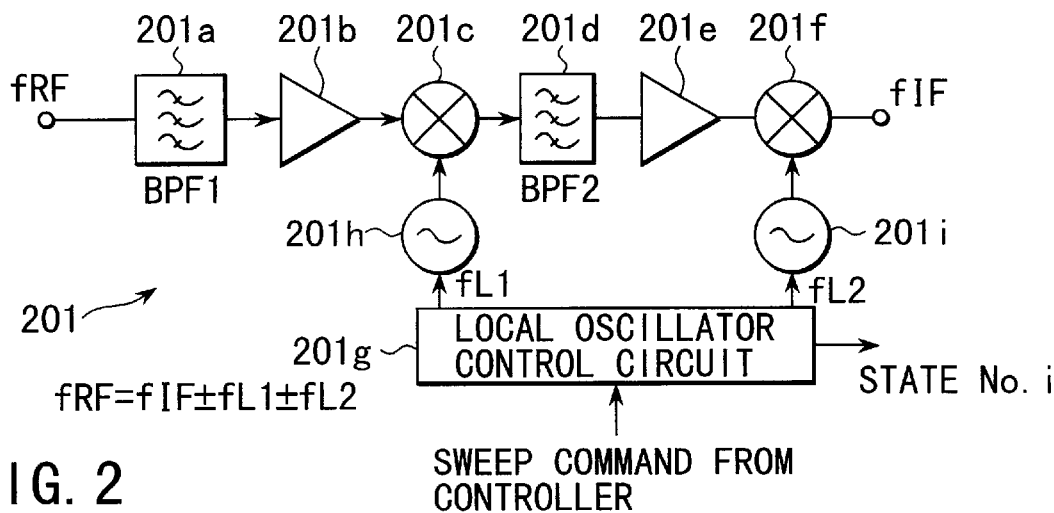
FIG. 2 a diagram showing a detailed configuration of a front end 201 in FIG. 1.
Figure 3:
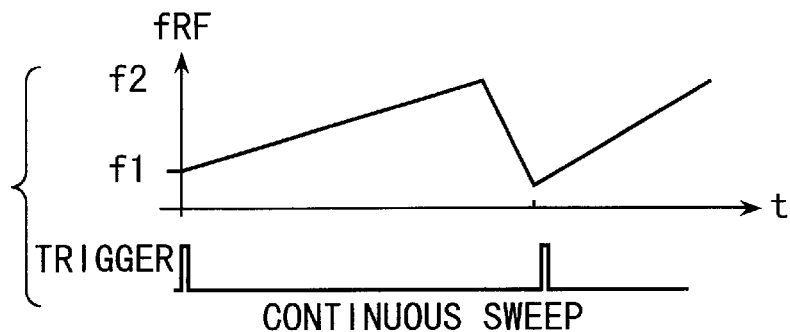
FIG. 3 is a diagram showing the continuous sweep mode in the front end 201.

FIG. 2 is a block diagram showing a detailed configuration of the front end 201 in FIG. 1.

Specifically, as shown in FIG. 2, the front end 201 includes a first BPF 1 201a, a second BPF 2 201d, first and second amplifiers 201b, 201e, first and second mixers 201c, 201f, first and second local oscillators 201h, 201i, and a local oscillator control circuit 201g.

The front end 201 converts a receiving-frequency input $f_{RF}$ into an intermediate frequency signal $f_{IF}$ and outputs it based on a predetermined sweep command described later supplied from the operating unit 211 of FIG. 1 through the controller 210 to the local oscillator control circuit 201g.

In the process, let $f_{L1}$ and $f_{L2}$ be the first and second local oscillation signals from the first and second local oscillators 201h, 201i, respectively. The relation shown below is held.

$$f_{RF} = f_{IF} \pm f_{L1} \pm f_{L2} \quad (3)$$

From the local oscillator control circuit 201g, a front end state number i or a trigger signal corresponding to the sweep command is output to the arithmetic unit 208.

As described above, the front end 201 is a down converter for converting the signal of the receiving frequency $f_{RF}$ into an intermediate frequency signal $f_{IF}$, where $f_{RF}$ and $f_{IF}$ are positive numbers.

Thus, assume that the impulse response of the IF filter is given as $$Re\{h_B(t)e^{j2\pi f_{IF}t}\} \quad (4)$$

and the RF input terminal is supplied with a signal expressed as $$Re\{x(t)e^{j2\pi f_{RF}t}\} \quad (5)$$

Then, the input terminal voltage of the log video amplifier (LVA) 203 is given as $$Re\{x*h_B e^{j2\pi f_{IF}t}\} \quad (6)$$

where $x*h_B$ is indicative of the convolution integral expressed as $$\int_{-\infty}^{\infty} x(t-\tau)h_B(\tau)d\tau = y(t) \quad (7)$$

The log video amplifier (LVA) 203 outputs the signal expressed as $$\xi(|y(t)|) = P(t) \quad (8)$$

where $|y(t)|$ is an envelope of the input of the log amplifier (LVA) 203, and $\xi(r)$ is a function of the real value r and a monotonie increasing. Normally, it is given as $$\xi(r) \approx \log_{10}(r) \quad (9)$$

The front end 201 includes variable or fixed local oscillator 201h, 201i and has the function of sweeping $f_{RF}$.

The front end 201 outputs a front end state number i or a trigger signal indicating the state of the local oscillators 201h, 201i, as described above.

Now, the symbols used in this specification of the invention and the accompanying drawings will be described.

Re$\{x(t)e^{j2\pi f_{RF}t}\}$: RF input signal, where x(t) is a complex number, t the time, and Re the real part.

Re$\{y(t)e^{j2\pi f_{IF}t}\}$: BPF output signal=log video amplifier input signal, where y(t) is a complex number, j=$\sqrt{-1}$ P(t): Output signal (real number) of the log video amplifier and as described above, expressed as $$P(t)=\xi(|y(t)|) \quad (11)$$

where $\xi$ is a monotonie increasing function.
m(k): ADC output code having a value of 0, 1, 2, ..., M-1, expressed as $$m(k)=\lfloor P(t_A+kT_S)/\Delta \rfloor \quad (12)$$

where k is a sample number and $t_A$ is a sampling start time.
h(m): Contents (data) of the memory 207 at address m, expressed as $$h(m)\in\{0, 1, 2, \ldots, 2^{W_D}-1\} \quad (13)$$

$W_D$: Bit width of the RAM (207) data
a: Amplitude of effective value of RF input
$f_{RF}$: Receiving frequency
a(l): Effective value amplitude of the signal expressed as $$x(t)=\sqrt{2}ae^{j2\pi f_{RF}t} \quad (14)$$

input as the RF input when the ADC code has transferred from l-1 to l with the receiving frequency made to coincide with $f_{RF}$ and the amplitude a (>0) increased gradually.
$f_1$: Sweep start frequency
$f_2$: Ending frequency
$i_0$: Marker position in frequency domain (time domain)
$D_i(l)$: Accumulation value of $$\tilde{D}_i(l):D_i(l), D_{i+1}(l), \ldots, D_{i+j-1}(l) \quad (15)$$

which is displayed equivalently to $D_i(l)$.
$d_j$: Boundary value of color band
$f_{IF}$: Nominal central frequency of IF filter (BPF)
$f_{L1}$, $f_{L2}$: First and second local oscillation frequencies
$N_w$: X-axis resolution, number of display dots per unit span
$T_w$: Sweep time
$T_p$: Suspended time (time when $f_{RF}$ remains constant)
q: Functional (permutation) for 1-to-1 mapping of $\{0, 1, 2, \ldots, N_w-1\}$ to $\{0, 1, 2, \ldots, N_w-1\}$
ω: $\{0, 1, 2, \ldots, M-1\}$, a set of ADC output codes $$q(i)\in\{0, 1, 2, \ldots, N_w-1\}: \quad (16)$$

Number indicating the receiving frequency as of obtaining the ith histogram in each sweep
$H_i(l)$: Histogram of $K_i$ codes $m(k_i)$, $m(k_i+1)$, ..., $m(k_i+K_i-1)$ expressed as $$H_i(l) = \sum_{k=0}^{K_i-1} \delta\{m(k_i+k)-l\} \quad (17)$$

where $$K_i = \sum_{l=0}^{M-1} H_i(l) \quad (18)$$

$$\delta(m) = \begin{cases} 1 & m=0 \\ 0 & m \neq 0 \end{cases} \quad (19)$$

$D_i(l)$: APD measurement (ratio of $m(k_i+k)$ being equal to or larger than l) of threshold value a(l) expressed as $$D_i(l) = \left\{\sum_{l'=l}^{M-1} H_i(l')\right\} / K_i \quad (20)$$

where APD is the ratio of time in which $|y(t)|\geq\sqrt{2}a(l)$ during the measurement time $T=K_iT_s$ from the measurement start time $t_i=t_A+k_iT_s$ to the measurement end time $t_i+T$. When it is written as APD(a(l)), a(l) is an amplitude threshold value having a dimension of the effective voltage.
g(a): Function along Y axis of functional scale display, for example, 10 $\log_{10}(a^2/1$ mW), 20 $\log_{10}(a/1$ μV) ...
$\eta_X(a)$: Monotonie decreasing function of a, expressed as $$0\leq\eta_X(a)\leq-1 \quad (21)$$

$\eta_X^{-1}(d)$: Inverse function of $\eta_X$, 0<d<1
$\lfloor x \rfloor$: Maximum integer not greater than x, for example, $\lfloor 3.1 \rfloor=3$, $\lfloor -1.1 \rfloor=-2$, $\lfloor 1 \rfloor=1$
$T_s$: Sampling period
$t_0$: Sweep start time
j: Number indicating color of color band j
d: APD value, $0\leq d\leq-1$ FIGS. 3 to 7 show different sweep modes of the front end 201.

Whenever the front end 201 frequency sweeps $f_{RF}$, it does so from the time point t0 when $f_{RF}=f_1$ and finishes it at time point t0+$T_w$ when $f_{RF}=f_2$.

In this case, $f_1<f_2$, $f_1$ is called the start frequency, $f_2$ the stop frequency, $T_w$ the sweep time and $t_0$ the sweep start time.

As a method of frequency sweeping the receiving frequency, the front end 201 can select a part or the whole of the continuous sweep, the temporarily suspended sequential sweep, the temporarily suspended random sweep and the zero span sweep, as shown in FIGS. 3 to 7. The process is automatically repeated for each request from the operating unit 21 or by the controller 210.

(1) Continuos sweep: The receiving frequency $f_{RF}$ (t) at time point t is as follows (FIG. 3):

$$f_{RF}(t)=f_1+(f_2-f_1)\cdot\{(t-t_0)/T_w\} \quad (22)$$

when $t=t_0$, a trigger signal is generated.

Figure 4:
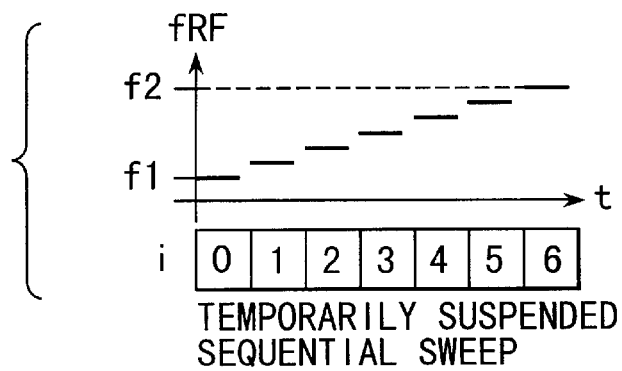
FIG. 4 is a diagram showing the temporarily suspended sequential sweep mode in the front end 201.

(2) Temporarily suspended sequential sweep: (FIG. 4)

$$f_{RF}(t)=f_1+\{(f_2-f_1)/N_w\}\lfloor\{(t-t_0)/T_w\}N_w\rfloor \quad (23)$$

The following state number i is generated.

$$i=\lfloor\{(t-t_0)/T_w\}N_w\rfloor\in\{0, 1, 2, \ldots, N_w-1\} \quad (24)$$

The time $T_p$ of suspension at a specific receiving frequency expressed as $$f(i)=f_1+(f_2-f_1)i/N_w \qquad (25)$$

is not more than $T_w/N_w$.

Figure 5:
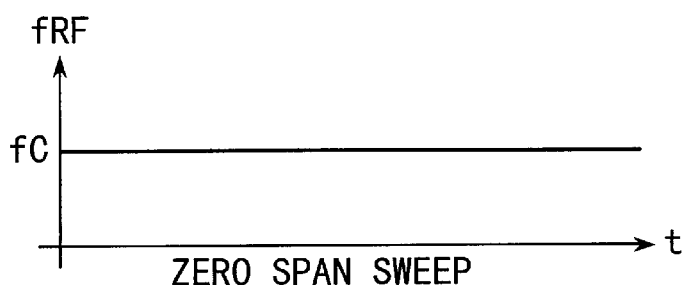
FIG. 5 is a diagram showing the zero span sweep mode in the front end 201.
Figure 6:
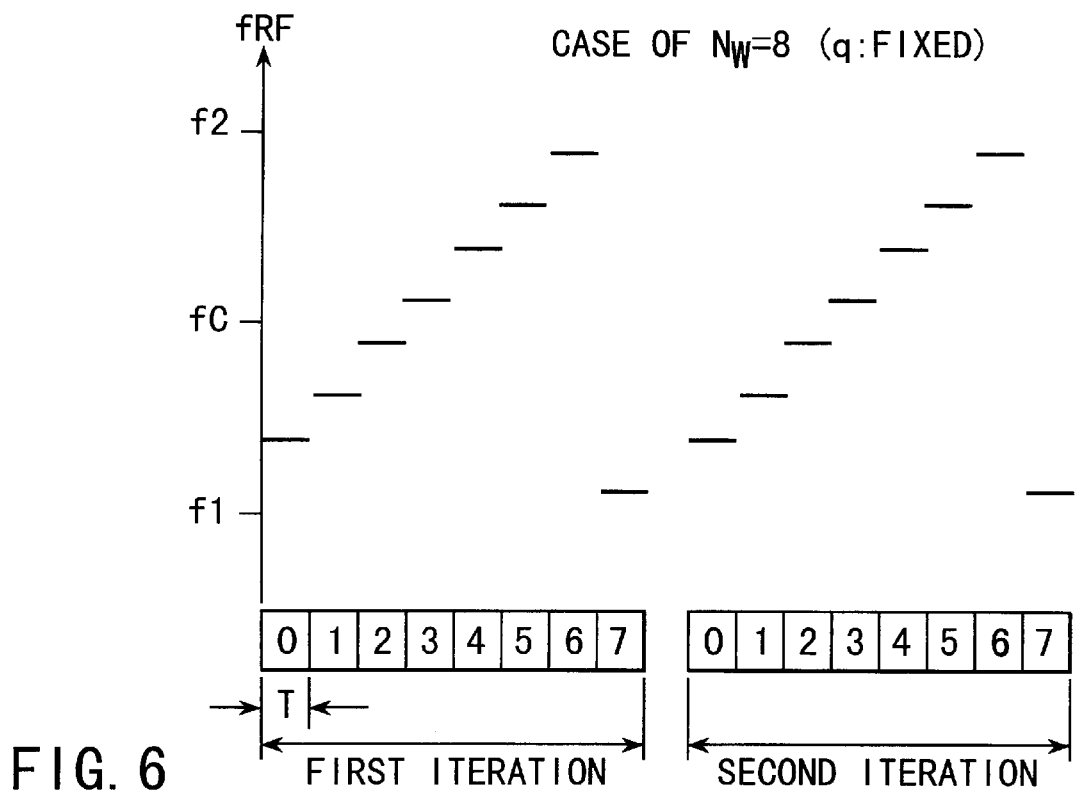
FIG. 6 is a diagram showing the temporarily suspended random sweep mode in the front end 201 (q fixed)
Figure 7:
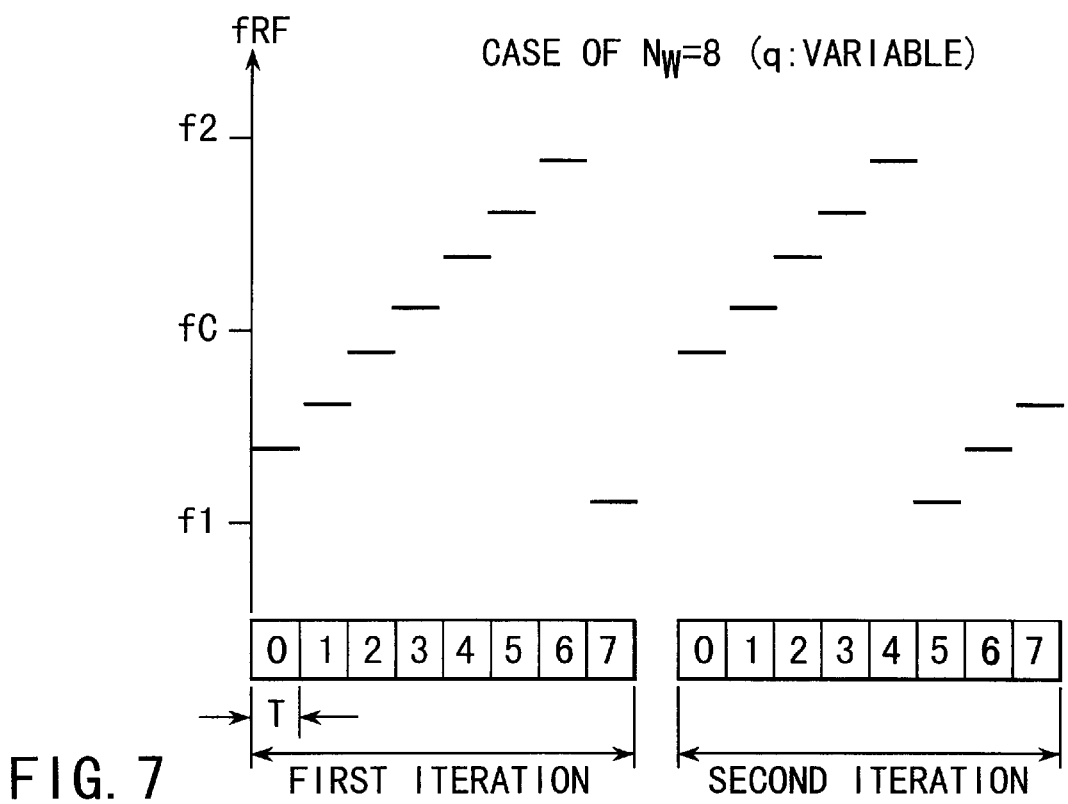
FIG. 7 is a diagram showing the temporarily suspended random sweep mode in the front end 201 (q variable)

(3) Zero span sweep: The receiving frequency is constant and no frequency sweep conducted (FIG. 5).

$$f_{RF}(t)=f_c \qquad (26)$$

The state number indicates whether the local oscillator is stable (i=1) or in transient state (i=0) (unstable).

(4) Temporarily suspended random sweep:

Let q be a function (permutation) for one-to-one mapping of $\{0, 1, 2, \ldots, N_w-1\}$, and q−1 be the function for inverse mapping. $q^{-1}(g(i))=i$ For example, $q(i)=(i+i_0) \bmod N_w$ is a permutation.

$$f_{RF}(t)=f_1+\{(f_2-f_1)/N_w\}q(\lfloor\{(t-t_0)/T_w\}N_w\rfloor) \qquad (27)$$

The following state number is generated.

$$q(i)\in\{0, 1, 2, \ldots, N_w-1\} \qquad (28)$$

A method of repeating the sweep is either by iterating it without changing the permutation q (FIG. 6) or by iterating it while changing the permutation q (FIG. 7), for example, by changing $i_0$ in $(i+i_0) \bmod N_w$ at each iteration.

Next, the ADC 204 converts the input P(t) from the log video amplifier (LVA) 203 into m(k) shown in the equation below as a sample of an integer value.

$$m(k)=\lfloor P(t_A+kT_s)/\Delta\rfloor \qquad (29)$$

where k is a sample number, $T_s$ a sampling period, $T_A$ the time when the code of sample number 0 is output from the ADC 204, and $\Delta$ a quantization step. In this equation, it is assumed that $$m(k)\in\{0, 1, 2, \ldots, M-1\}\in\omega \qquad (30)$$

In the 8-bit ADC 204, for example, $M=2^8$.

Figure 8:
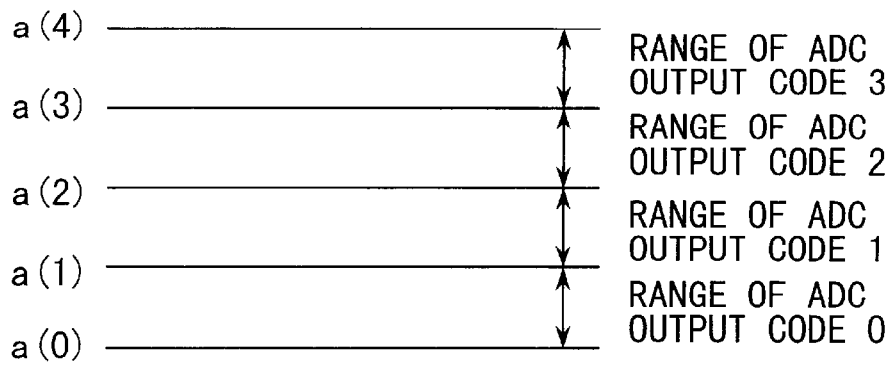
FIG. 8 is a diagram showing the relation between the threshold value of the ADC 204 and the output code in FIG. 1.

FIG. 8 shows the relation between the threshold value and the output code of the ADC 204.

Specifically, when the output code is m, the effective value amplitude a of CW (carrier wave) is included in the range given as $$a(m)\leq a<a(m+1) \qquad (31)$$

Then, the ith histogram measurement by the histogram measurement circuit 206 is conducted as follows.

The histogram of $K_i$ samples $m(k_i)$, $m(k_i+1)$, $m(k_i+2)$, ..., $m(k_i+K_i-1)$, $k_{i+1}>k_i+K_i-1$ is determined according to the following equation.

$$H_i(l) = \sum_{k=0}^{K_i-1} \delta\{m(k_i+k)-l\}, \qquad (32)$$

$$l \in \omega$$

The range of the argument l covers all the codes $\omega$ of the ADC 204. Also, $$\sum_{l=0}^{M-1} H_i(l) = K_i \qquad (33)$$

The time ratio when the effective value amplitude of the object signal is not less than a(l) during the period from $T_A+k_iT_s$ to $T_A+(k_i+K_i-1)T_s$ is expressed by $$Di(l) = \left\{\sum_{l'=l}^{M-1} H_i(l')\right\}/K_i \qquad (34)$$

Now, a method of determining the threshold value a(l) in the ADC 204 will be explained with reference to FIG. 9.

Assume that a CW (carrier wave) of frequency $f_{RF}$ (Hz) and amplitude a $V_{RMS}$ is input to the front end 201 as an object signal in the form of $$c(t)=Re\{\sqrt{2}ae^{j2\pi f_{RF}t}\} \qquad (35)$$

Assume that when a is gradually increased, the output of the ADC 204 changes from m to m+1 at a threshold value $a(m)V_{RMS}$, where $f_{RF}$ is the measured center frequency converted into the center frequency of the RBW filter 203 in the front end 201.

The relation between the threshold value a(m) and a(m+1) is given as $$a(m)<a(m+1) \qquad (36)$$

Figure 9:
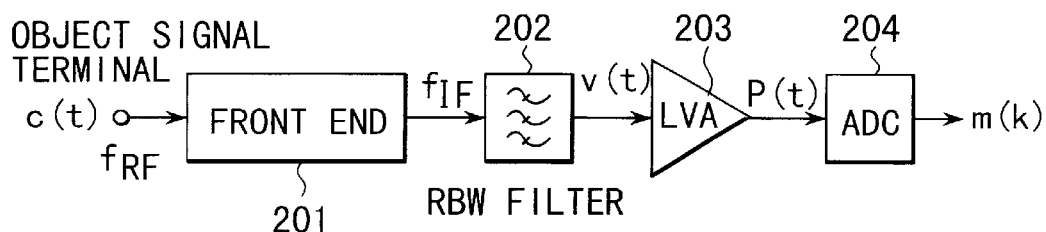
FIG. 9 is a diagram for explaining a method of determining the threshold value a(l) in the ADC 204.

In the case of FIG. 9, the input to the LVA 203 is given as $$U(t)=Re\{y(t)e^{j2\pi f_{IF}t}\} \qquad (37)$$

As described above, the output of the LVA 203 is $$P(t)=\xi(|y(t)|) \qquad (38)$$

where $\xi(a)$ is the monotonic increase function, for example, $$\xi(a)=ln\, a \qquad (39)$$

Also, the output code m(k) from the ADC 204 is expressed as $$m(k)=\lfloor P(t_A+kT_s)/\Delta\rfloor \qquad (40)$$

where $\Delta$ is a quantization step, and $T_s$ a sampling period.

In this equation expressing m(k), assume that $$\lfloor P(t_a+kT_s)/\Delta\rfloor=\lfloor X\rfloor \qquad (41)$$

Then, $\lfloor X\rfloor$ indicates a maximum integer not exceeding X. For example, $\lfloor 3.1\rfloor=3$, $\lfloor 3\rfloor=3$, $\lfloor -1.1\rfloor=-2$.

Assume that the initial value of the memory 207 is set to $h_{i-1}(l)$ and A of the memory 207 is set to $m(k_i)$, $m(k_i+1)$, ..., $m(k_i+K_i+1)$ sequentially for each $T_s$ seconds. After $KT_s$ seconds, the following remains in the memory 207.

$$h_i(l)=\{H_i(l)+h_{i-1}(l)\}\bmod 2^{W_D} \qquad (42)$$

Now, a specific example of the histogram measuring circuit 206 will be explained.

Figure 10:
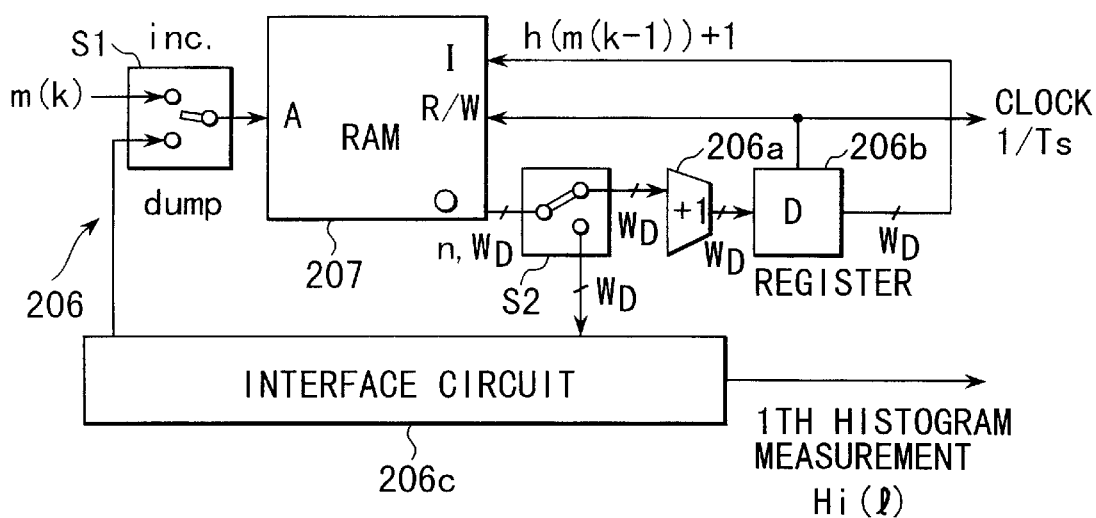
FIG. 10 is a block diagram showing a specific example of the histogram measuring circuit 206 in FIG. 1.

FIG. 10 is a block diagram showing a specific example of the histogram measuring circuit 206 of FIG. 1.

FIGS. 11A to 11C are timing charts for explaining the operation of the histogram measuring circuit 206 shown in FIG. 10.

Specifically, as shown in FIG. 10, the histogram measuring circuit 206 includes switches S1, S2 for turning between a histogram measurement mode (increment: inc.) and a measurement result output mode (dump), an adder (ADD) 206a, a register 206b, a memory 207 and an interface circuit 206c.

The address of the memory 207 in increment (inc.) mode is m(k).

Assume that the memory 207 applies the data designated by the address input A=m(k) to the 0 port at the rising edge of a clock and holds it until the rising edge of the next clock.

At this time, the data output from the RAM 207, as shown in FIG. 11B, is h(m(k)), to which the adder 206a adds 1.

As a result, h(m(k))+1 is input to the register 206b.

At the rising edge of the clock of $1/T_s$ Hz, this data is transferred to the output of the register 206b.

Thus, as shown in FIG. 11C, the register 206b outputs (m(k−1))+1 immediately before the edge and h(m(k))+1 immediately after the edge.

Accordingly, the data immediately before the edge is written in the memory 207.

In the process, the mode of read operation (R) and write operation (W) of the memory 207 is controlled by the clocks 1, 0 shown in FIG. 11A.

Dump mode: In this mode, the clock is fixed to the state of 1.

And the switches S1, S2 are turned to dump side, and the addresses $$l \in \{0, 1, \ldots, M-1\} = \omega \tag{43}$$

are sequentially generated from the interface circuit 206c, and data h(l) is read from the memory 207.

FIG. 12 shows the relation of timing between inc mode and dump mode.

Assume that the inc mode prevails while time t is in the range of $T_A + k_i T_s \leq t < T_A + (k_i + K_i + 1) T_s$ as shown in FIG. 12. After the samples $m(k_i), m(k_i+1), m(k_i+2), \ldots, m(k_i+K_i)$ are input to the histogram measuring circuit 206, the data read from the memory 207 in dump mode is $$h_i(l) = \left\{ h_{i-1}(l) + \sum_{k=0}^{K_i-1} \delta(m(k_i + k) - l) \right\} \mod 2^{W_D}, \tag{44}$$

$$l \in \omega \tag{45}$$

In other words, the number of times the address m has remained l is stored at the address l of the memory 207.

Here, assume that the word width of the memory 207 is $W_D$ bits. Also, $h_{i-1}(l)$ is the memory data immediately before the time point $T_A + k_i T_s$.

In this way, inc, dump, inc, dump are iteratively measured, and if each inc mode continues for less than $2^{W_D} T_s$, $$0 \leq \sum_{k=0}^{K_i-1} \delta(m(k_i + k) - l) < 2^{W_D} \tag{46}$$

Therefore, $$\{h_i(l) - h_{i-1}(l)\} \mod 2^{W_D} = \sum_{k=0}^{K_i-1} \delta(m(k_i + k) - l) \tag{47}$$

coincides with the number of times Hi(l) that $m(k_i)$, $m(k_i+1), \ldots, m(k_i+K_i-1)$ is l.

In FIG. 12, temporal relation is given as $$T_s > T_{READ} + T_{WRITE} + T_{ADD}, \tag{48}$$

$$T_D > M \cdot T_{READ} \tag{49}$$

where $T_D$ is the time in dump mode, $T_{READ}$ the read time (~25 nsec), $T_{WRITE}$ the write time (~25 nsec), and $T_{ADD}$ the +1 add time ~10 nsec.

When M is 256, for example, 6.4 μsec<TD.

Now, the arithmetic operation for color band display in the arithmetic unit 208 will be explained.

Specifically, the arithmetic unit 208 reads the data $h_i(0)$, $h_i(1), \ldots, h_i(M-1)$ of the memory 207 from the histogram measuring circuit 206, and generates the ith measurement of the histogram $H_i(l)$ by the following arithmetic operation.

$$H_i(l) = (h_i(l) - h_{i-1}(l)) \mod 2^{W_D} \tag{50}$$

After that, the value $D_i(l)$ of the APD for the threshold value a(l) is determined by the following formula, where APD indicates the time ratio in which the instantaneous amplitude value exceeds $\sqrt{2}a(l)$ in the measurement time.

$$D_i(\ell) = \left\{ \sum_{\ell'=\ell}^{M-1} H_i(\ell') \right\} / K_i, \tag{51}$$

$$K_i = \sum_{\ell=0}^{M-1} H_i(\ell) \tag{52}$$

FIG. 13 shows the manner in which the output of the ADC 204 is calibrated in advance.

Specifically, at the time of calibration, the RF input terminal of the front end 201 under zero span sweep of $f_{RF}$ is supplied with $$Re\{\sqrt{2}ae^{j2\pi f_{RF}t}\} \tag{53}$$

The RMS amplitude a is gradually increased as shown in FIG. 13, and the value thereof when the ADC output changes from l−1 to l is stored as the level data a(l) beforehand in the internal memory 208a of the arithmetic unit 208.

In the case where the RMS amplitude of the input is fixed to a(l) and the APD is measured continuously in zero span. Then, $D_i(l) = 0.5$.

In this case, the input noise is assumed to be sufficiently small.

The arithmetic unit 208 calculates the color band based on $D_i(l)$ calculated above and the level data a(l) in store, and supplies the display data for color band display to the display unit 209.

A specific example of the color band display by the display unit 209 will be described later.

Now, the operation for calculation of the display of the function scale by the arithmetic unit 208 will be explained.

First, the arithmetic unit 208 calculates the functional scale $g(\eta_x^{-1}(D(l)))$. This function g is a monotonie increasing function and is specified in advance.

Also, assume that $$D(\ell) = \{1/(j - i_0 + 1)\} \sum_{i=i_0}^{j} D_i(\ell), \tag{54}$$

$$\ell \in \omega$$

The functional scale will be explained. The ordinate of the functional scale represents the amplitude. One of $dB_{\mu V} = 20 \log_{10}(a/1\ \mu V)$, $dB_m$, dB, V and W is selected and scaled equidistantly.

The abscissa of the functional scale, on the other hand, is the time ratio and scaled as 0<d<1 or the percent value thereof.

Assuming the abscissa on the screen of the display unit 209 is X and the ordinate thereof is Y, g, $\eta X-1$ are selected, and $X=g(\eta_X^{-1}(D(l)))$, $Y=g(a(l))$ are plotted for all $$l \in \omega \tag{55}$$

and the spacing between the plotted points is interpolated.

Figure 14:
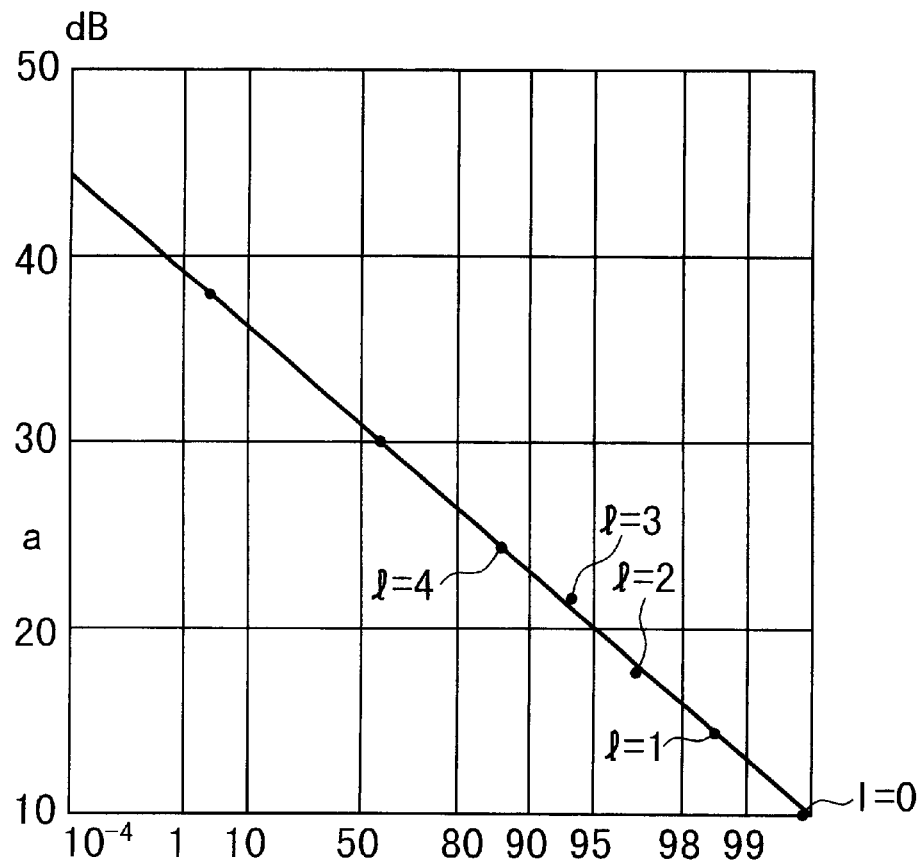
FIG. 14 is a diagram showing an example in which $p_x$ represents a Rayleigh distribution given as $g(x)=20 \log_{10}(x)$ which assumes a straight line when the RF input is a thermal noise.

FIG. 14 shows the case in which $p_x$ is the Rayleigh distribution $g(x)=20 \log_{10}(x)$, which is linear when the RF input is a thermal noise.

Now, the display by the functional scale described above will be explained.

First, $$p_X=(-d/dx)\eta_X(x) \tag{56}$$

has various forms, and can be selected as a menu format from the Rayleigh distribution, normal distribution, exponential distribution and $\chi 2$ distribution by the operating unit 211 and the display unit 209.

Also, $$\eta_X(X) = \int_X^\infty p(x')\,dx' \tag{57}$$

is a monotonie decreasing function and has an inverse function $\eta_X^{-1}$.

In this case $0<\eta_X(X)\leq 1$

On the other hand, g is a monotonie increasing function and can be selected from $$g(X)=20 \log_{10}X,\ 10 \log_{10}X,\ X^2,\ \sqrt{X},\ lnX,\ \ldots,\ \text{etc.} \tag{58}$$

For example, in the case of the Rayleigh distribution, $$p_X(x)=\{_0^{x\ exp\ (-x^2/2)}\}_{x<0}^{x\geq 0} \tag{59}$$

$$\eta_X(x)=\{_1^{exp(-x^2/2)}\}_{x>0x<0} \tag{60}$$

where $$\eta_X^{-1}(d)=\sqrt{-2\ln(d)},$$

$$g(X)=20 \log_{10}X, \tag{61}$$

then $$g(\eta_X^{-1}(d))=10 \log_{10}(-2\ ln(d)) \tag{62}$$

where exp is assumed to be $e^X$

Figure 15:
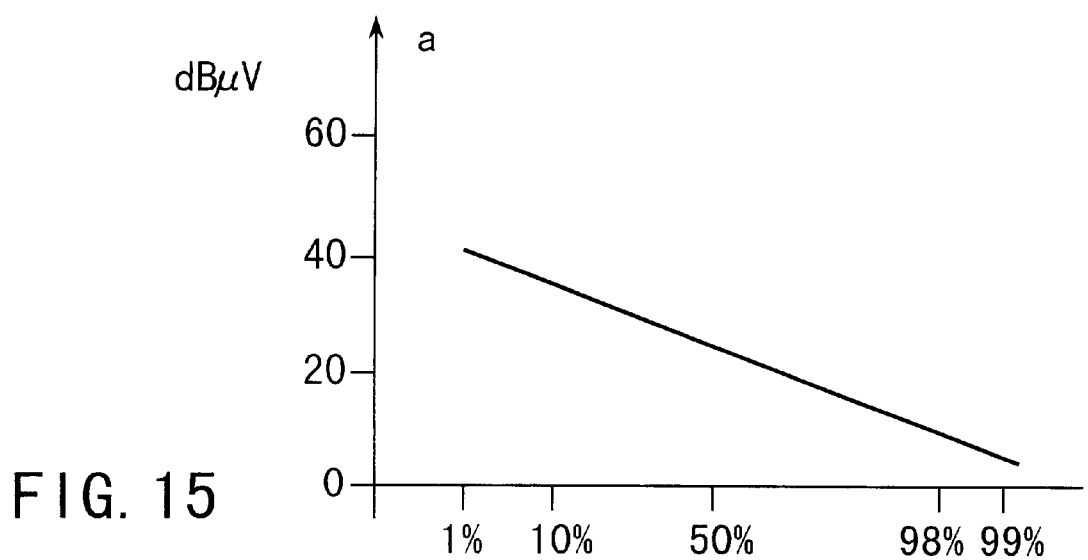
FIG. 15 is a graph indicating that the RF input assumes a straight line when input as thermal noises and therefore thermal noises and other noises can be identified.

FIG. 15 shows this relation in a graph.

Specifically, the graph of FIG. 15 assumes a straight line when the RF input to the front end 201 is a thermal noise and therefore can discriminate a thermal noise and other noises.

Now, an example method of producing the functional scale will be explained.

$$\eta_X(x_0) = P_{rob}(X \geq x_0) = \int_{x_0}^\infty p_X(X)\,dx \tag{63}$$

where $P_x(x)$ is PDF of the probability variable x.

$$Y=g(X) \tag{64}$$

where g is a monotonie increasing function and is assumed to have an inverse function $g^{-1}(Y)$.

Let $y_0=g(x0)$. Obviously, $$d = \eta_Y(y_0) = P_{rob}(y \geq y_0) \tag{65}$$

$$= P_{rob}(X \geq x_0) = \int_{x_0}^\infty p_x(X)\,dx = \eta_x(x_0) \tag{66}$$

Thus, when $0<d<1$, $x0=\eta X^{-1}(d)$ exists.

Also, $$y_0=\eta_Y^{-1}(d)=g(x_0)=g(\eta_X^{-1}(d)) \tag{67}$$

Therefore, $\eta_Y^{-1}=g(\eta_X^{-1})$.

For example, in the case of Rayleigh distribution, $$P_X(x)=\{_0^{x\ exp\ (-x^2/2)}\}_{x>0}^{x\geq 0} \tag{68}$$

$$\eta_X(x)=\{_1^{exp(-x^2/2)}\}_{x\leq 0}^{x>0} \tag{69}$$

$$\eta_X^{-1}(d)=\sqrt{-2ln(d)} \tag{70}$$

where $$Y=g(X)=20 \log_{10}X=(20/ln(10))ln(X) \tag{71}$$

then $$Y = \eta_Y^{-1}(d) = (20/\ln(10))\ln(\sqrt{-2\ln(d)}) \tag{72}$$

$$= (10/\ln(10))\ln(-2\ln(d)) = 10\log_{10}(-2\ln(d))$$

When d is 0.99, 0.9, 0.5, 0.1, 0.01, 0.001, 0.0001, 0.00001, $\eta_Y^{-1}(d)=10 \log_{10}(-2\ ln(d))$ is given as -17, -6.7, 1.4, 6.6, 9.6, 11.4, 12.7 and 13.6, respectively, and $4.05\times\{\eta_Y^{-1}(d)-1.4\}$ is given as -74.5, 32.8, 0, 21.1, 33.2, 40.5, 45.8, 49.5, respectively.

By the way, the envelope r(t) of the thermal noise is distributed in Rayleigh fashion.

Thus, when $P_{rob}(r(t)\geq A)=d$ is plotted in the functional scale graph, plot points occur in straight fashion.

Specifically, $P_{rob}(r\geq A)=d$ is plotted by setting the coordinate $\eta_Y^{-1}(d)$ $(P_{rob}(r\geq A))$, $20 \log_{10}A$.

Figure 16:
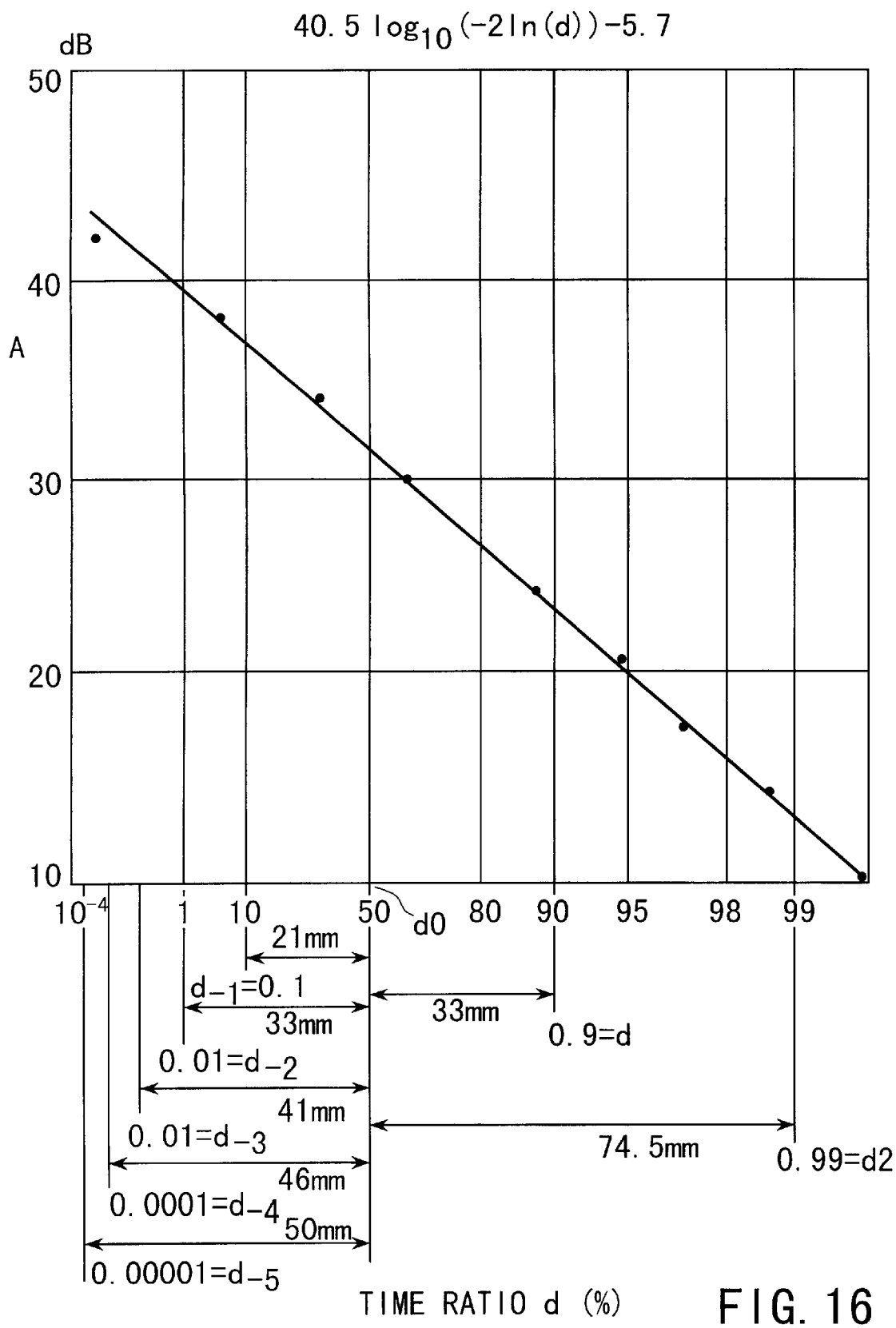
FIG. 16 is a diagram showing an example of a functional scale.

FIG. 16 shows an example of the functional scale graph. This functional scale graph has an ordinate (horizontal line) of dB scale $d_i=0.99, 0.9, 0.5, 0.1, 0.01, 0.001, 0.0001, 0.00001$ and a corresponding vertical line $\eta_Y^{-1}(d_i)$ as an abscissa.

With d0=0.5 as a reference, the abscissa can be expressed in mm as $$40.5 \log_{10}(-2\ ln(d))-5.7\ \text{mm} \tag{73}$$

which is a horizontal coordinate.

Specifically, FIG. 16 shows an example of the functional scale graph for APD of the thermal noise envelope A which has an ordinate of $20 \log_{10}A$ and an abscissa of $$\eta_Y^{-1}(d)=10 \log_{10}(-2\ ln(d)) \tag{74}$$

Now, the display by accumulated calculation will be explained.

The APD obtained by each sweep can be displayed after accumulation.

Specifically, assume that the APD that has been measured after k iterations of sweep is $D_{i+(k-1)Nw}(l)$.

The accumulated APD after L sweep iterations is given as $$\tilde{D}_j(\ell) = (1/L)\sum_{k=1}^{L} D_{j+(k-1)N_W}(\ell) \quad (75)$$

where $N_w < (T_w/T_s)/K$, $K_i < K$.

In the random sweep described above, however, $$\tilde{D}_j(\ell) = (1/L)\sum_{k=1}^{L} D_{q_k^{-1}(j)+(k-1)N_W}(\ell) \quad (76)$$

Also, in the zero span sweep described above, $j_{i+1} > j_i$ is designated to display $$\tilde{D}_i(\ell) = \{1/(j_i+1-j_i)\}\sum_{k=0}^{j_i+1-j_i-1} D_{j+k}(\ell) \quad (77)$$

The abscissa represents $T_s k j_i$ or $T_s k j_{i+1}$ or the average of the two.

And i, $D_i(l)$ in each sweep described above are displayed by color band.

For the continuous sweep described above, on the other hand, i is assigned in the following manner according to the time $t-t_0$ to elapsed from the trigger.

$$i = \lfloor \{(t-t_0)/T_w\} N_w \rfloor \quad (78)$$

where f(i) is assumed to be the receiving frequency $f_{RF}$ for i in other than zero span sweep.

In zero span sweep, on the other hand, the time elapsed from the measurement start point is used to give f(i)

$$f(i) = k_i T_s,$$

or $$f(i) = k_{i+1} T_s,$$

or $$f(i) = (k_i + k_{i+1})(T_s/2). \quad (79)$$

The display unit 209 displays f(i) on X axis and the color band of $D_i(l)$ on Y axis. In this case, $D_i(l)$ can be reread as $\tilde{D}_i(l)$ FIG. 17 shows an example of the color band display screen by accumulation calculation.

Figure 17:
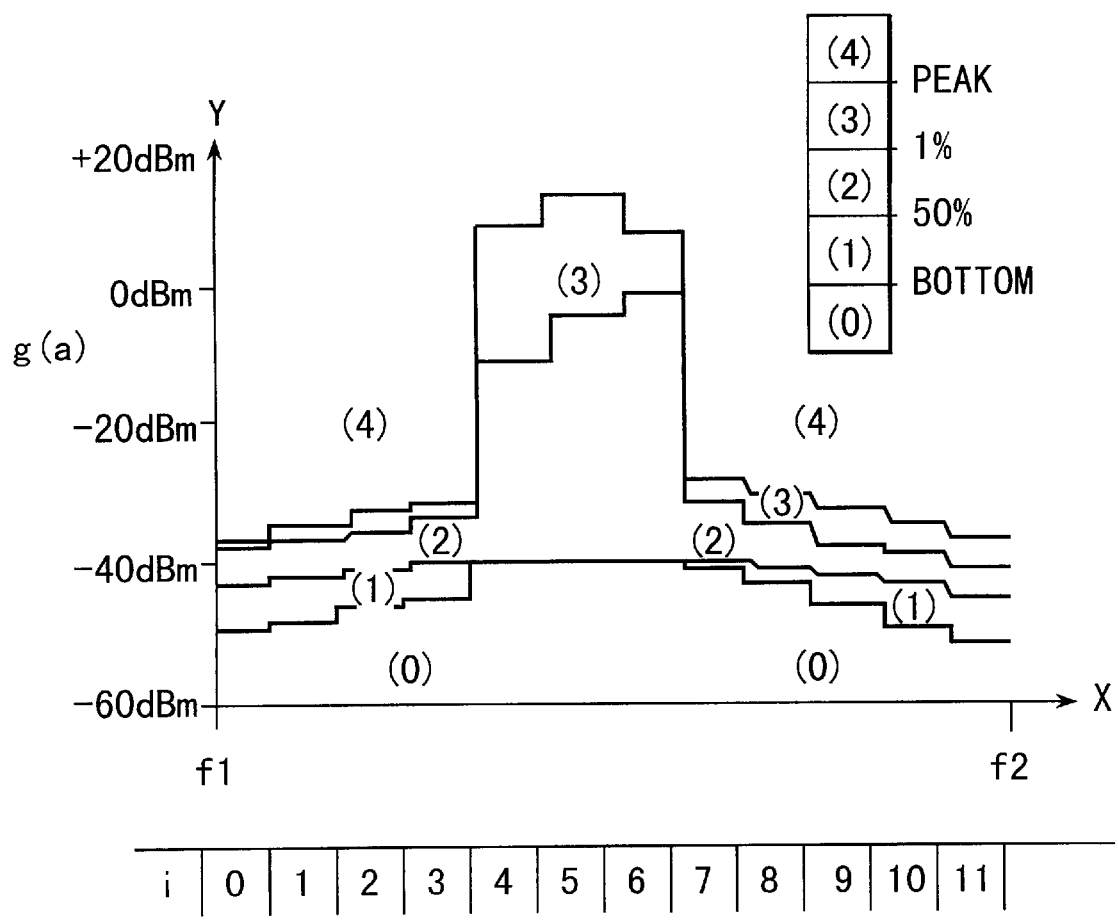
FIG. 17 is a diagram showing an example of a color band display screen based on accumulation process.

In FIG. 17, however, the i number shown in the lower part is not displayed on the actual screen.

Now, a method of generating a color band will be explained.

Assume that J+2 is the number of color bands and $d_0 = 1$, $d_J = 0$.

The color band boundaries $$0 < d_{J-1} < d_{J-2} < \ldots < d_2 < d_1 < 1 \quad (80)$$

are designated in advance arbitrarily.

(1) Generation of color band J+1

The peak boundary value is determined as follows.

$$D_i(l_{J+1}+2), D_i(l_{J+1}+1) = d_J 0 \quad (81)$$

and $$D_i(l_{J+1}) > d_J \quad (82)$$

At this time, the peak boundary value is given as $a(l_{J+1}+1)$, and the area expressed as $a \geq a(l_{J+1}+1)$ at horizontal position corresponding to f(i) is totally covered by the color band J+1.

(2) Generation of color band 0

The bottom boundary value is assumed to be $a(l_0)$ $$D_i(l_0-2), D_i(l_0-1) = d_0 = 1 \quad (83)$$

and $$D_i(l_0) < d_0 \quad (84)$$

at this time, the bottom boundary value is assumed to be $a(l_0)$, and the area where $a < a(l_0)$ at horizontal position corresponding to f(i) is totally covered by the color band 0.

(3) Generation of color bands 1, 2, . . . , J

In this case, assume that $$j \in \{1, 2, \ldots J\} \quad (85)$$

For all the values $l_j$ meeting the relation $d_j \leq D_i(lj) < d_j - 1$, the area where $a(l_j) \leq a < a(l_j+1)$ at horizontal position values corresponding to f(i) is totally covered with the color band j.

In the absence of l meeting the relation $d_j \leq D_i(lj) < d_j - 1$, the color band j is not generated.

Since g is a monotonic increasing function, $a \geq a(l)$ and $g(a) \geq g(a(l))$ are equivalent.

Therefore, $a \geq a(l)$ implies to $g(a) \geq g(a(l))$, $g(a) \geq g(a(l))$ implies $a \geq a(l)$.

Figure 18:
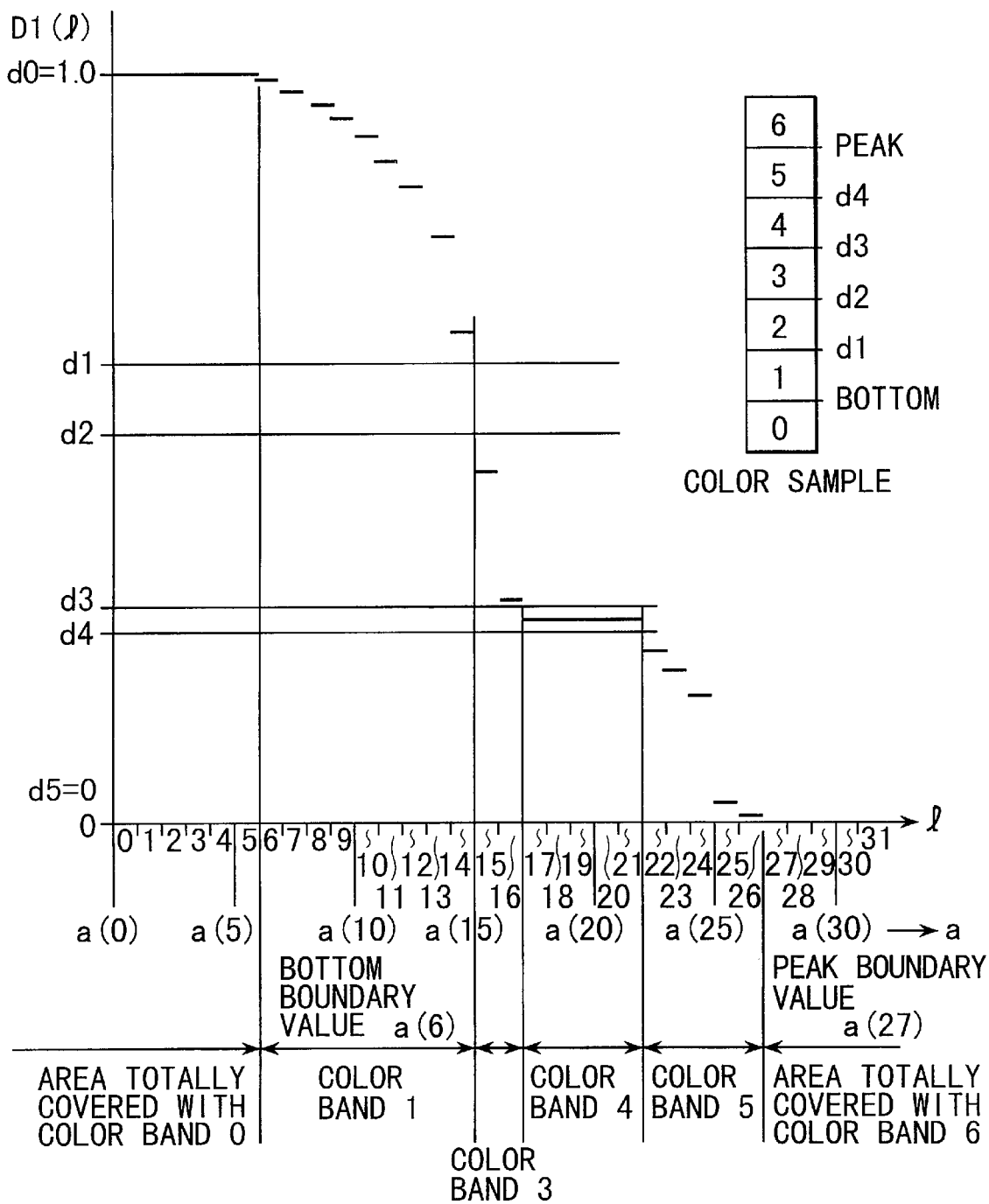
FIG. 18 is a diagram showing an example of generating the color band for J of 5.
Figure 19:
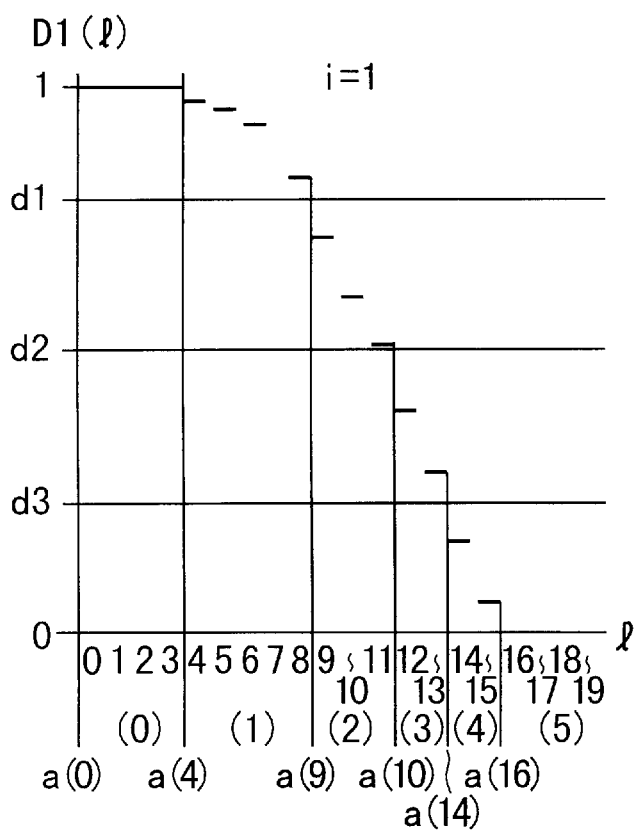
FIG. 19 is a diagram showing an example of generating the color band for displaying six colors when J is 4.
Figure 20:
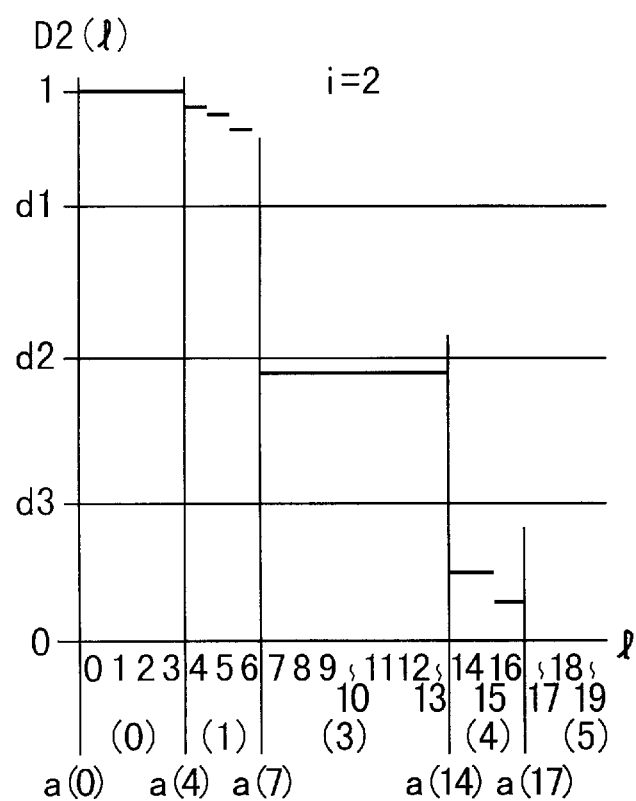
FIG. 20 is a diagram showing an example of generating the color band for displaying six colors when J is 4.
Figure 21:
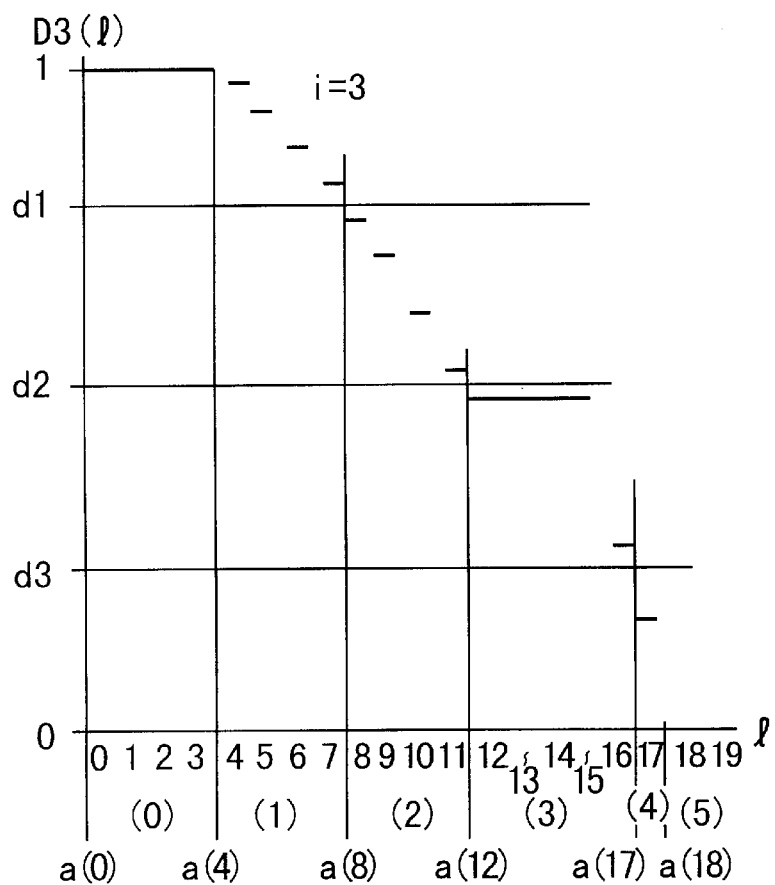
FIG. 21 is a diagram showing an example of generating the color band for displaying six colors when J is 4.

FIG. 18 shows a case of color band generation for J=5.

$$l_5 = 26, l_0 = 6$$

$$l_1 \in \{6, 7, \ldots, 14\}$$

$$l_2 \in \phi, \phi \text{ is a null set.}$$

$$l_3 \in \{15, 16\}$$

$$l_4 \{17, 18, \ldots, 21\}$$

$$l_5 \in \{22, 23, \ldots, 26\} \quad (86)$$

In this case, the color band 2 is not generated.

In FIG. 18, for convenience' sake, the color band areas 0, 1, 3, 4, 5, 6 are totally covered along the abscissa. Actually, however, they are shown along Y axis on the screen of the display unit 209.

FIGS. 19 to 22 show a case of generating a color band for six-color display with J of 4.

In each of these diagrams, (0), (1), . . . (5) indicate the areas totally covered by different colors, respectively.

Figure 22:
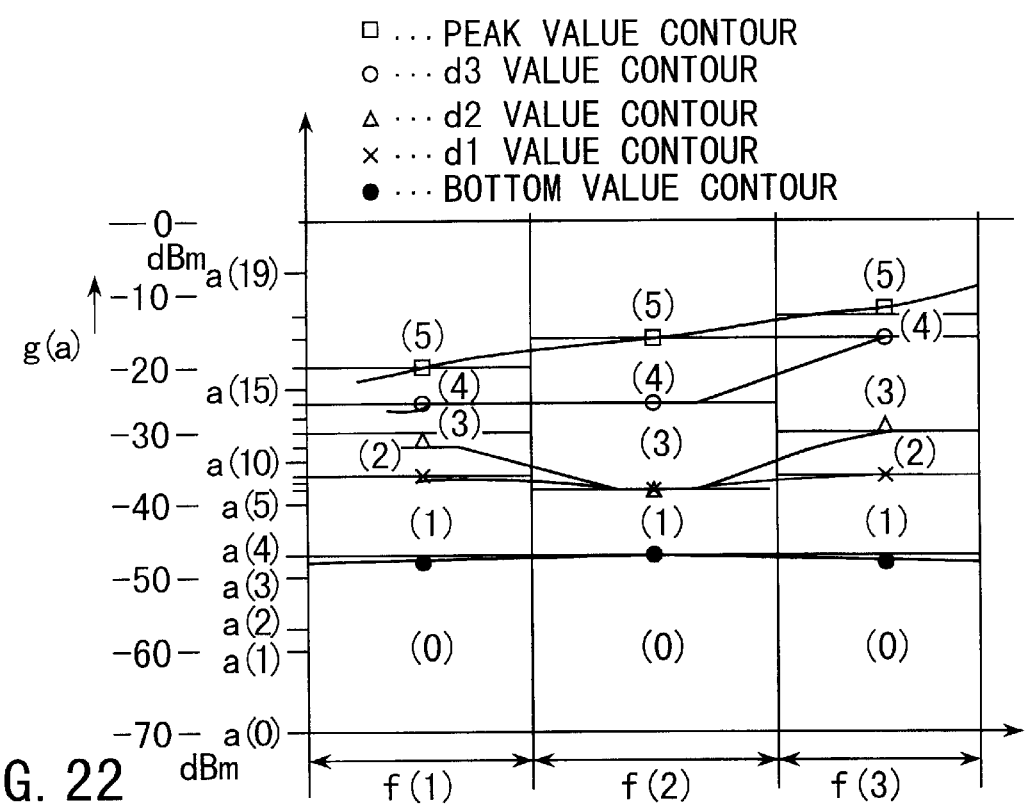
FIG. 22 is a diagram showing an example of generating the color band for displaying six colors when J is 4.

In FIG. 22 where the contours are shown with the color bands, the scale marks $a(1), a(2), \ldots, a(19)$ along the ordinate are not shown actually on the screen. Instead, on the actual screen, the Y-axis indication (−70 dBm to 0 dBm) is scaled in dBm.

Also, in FIG. 22, the scale marks a(l) on Y axis need not be equidistant.

Figure 23:
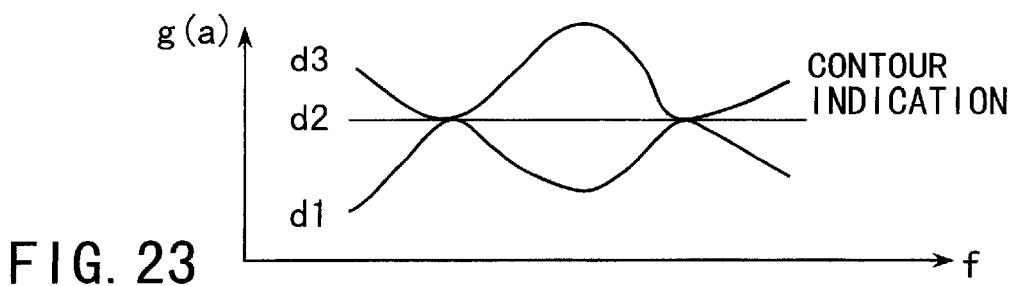
FIG. 23 is a diagram indicating that the contour cannot be separated in the view of the fact that contours of different threshold values may be superposed in contour display.

In the contour display, as shown in FIG. 23, contour lines of different threshold values may be overlapped and cannot be separated.

Even when the contours are plotted in different colors, the overlapped portions are not colored. Since the contour lines are colored, however, they cannot be easily identified from afar.

In other words, in contour display, the intuitive determination of a human event is impossible and the problem of display deterioration is posed when the number of pixels is small.

Figure 24:
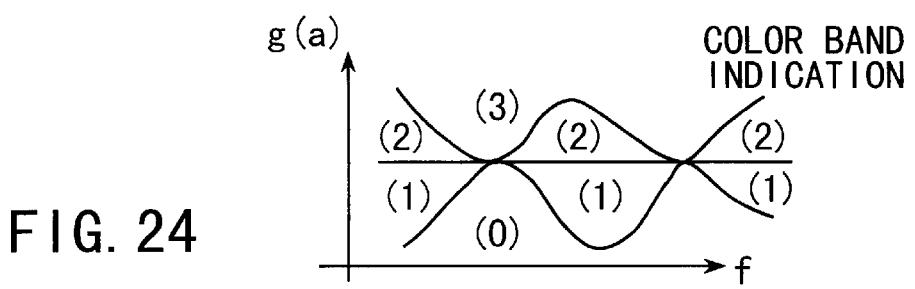
FIG. 24 is a diagram indicating that the color band display according to this invention is not superposed and makes it possible to identify the color band from a far point.

In the color band display according to this invention, in contrast, as shown in FIG. 24, the color bands on display are not overlapped. Therefore, identification from afar is easy, and the display is possible even with a small number of pixels.

Figure 25:
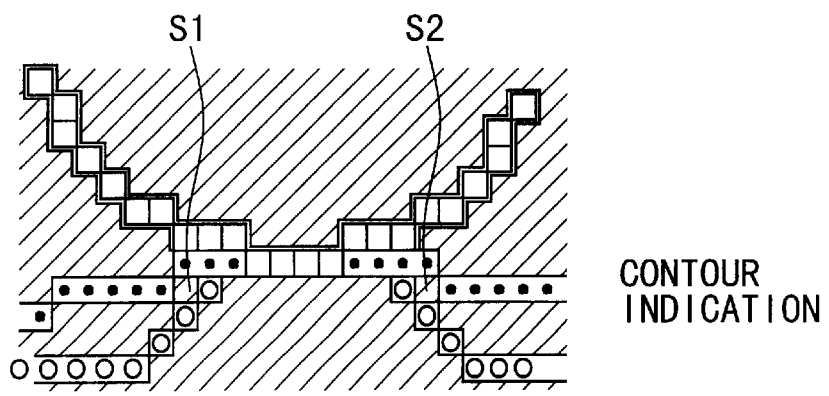
FIG. 25 is a diagram indicating that unrequired spots S1, S2 may occur in the contour display.

Another problem posed in the contour display is that unrequired spots S1, S2 are generated as shown in FIG. 25.

Figure 26:
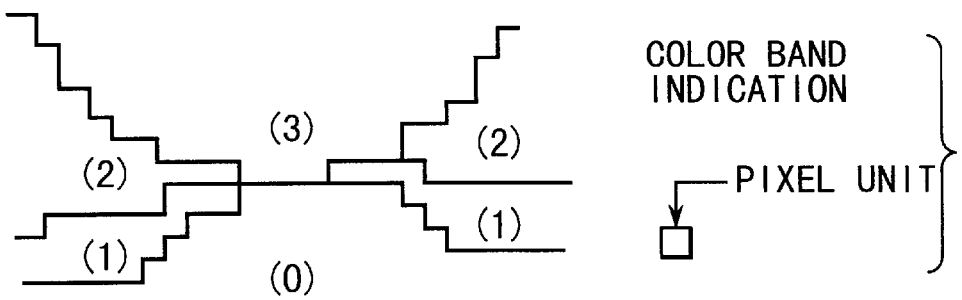
FIG. 26 is a diagram indicating that the color band display according to the invention is free of the unrequired spots unlike in the contour display.

According to this invention, in contrast, such unrequired spots are not generated in the color band display as shown in FIG. 26.

Now, an explanation will be given of an example in which the color band and the functional scale are displayed on the two sides of the same screen.

In this case, the ordinate represents the scale g(a) for amplitude, and the abscissa f(i) and $g(\eta_X^{-1}(d))$.

As an example, a knob or a key not shown in the operating unit 211 is used for designating a single $$l \in \omega \tag{87}$$

Thus, in the manner described above, g(a(l)), $g(\eta_X^{-1}(D(l)))$ displayed on the screen of the display unit 209 are intensified and the values of a(l), D(l) are numerically displayed in the same screen of the display unit 209.

As another example, the a knob or a key not shown of the operating unit 211 is manipulated to specify a single value of d meeting $0 \leq d \leq 1$. By thus determining the sole l meeting $D(l) > d \geq D(l+1)$, the value for l displayed on the screen of the display unit 209 is intensified and numerically displayed in the manner described above.

As an alternative, the value for l meeting $D(l-1) > d \geq D(l)$ or $D(l-1) \geq d > D(l)$ or $D(l) \geq d > D(l+1)$ can be intensified and numerically displayed.

Figure 27:
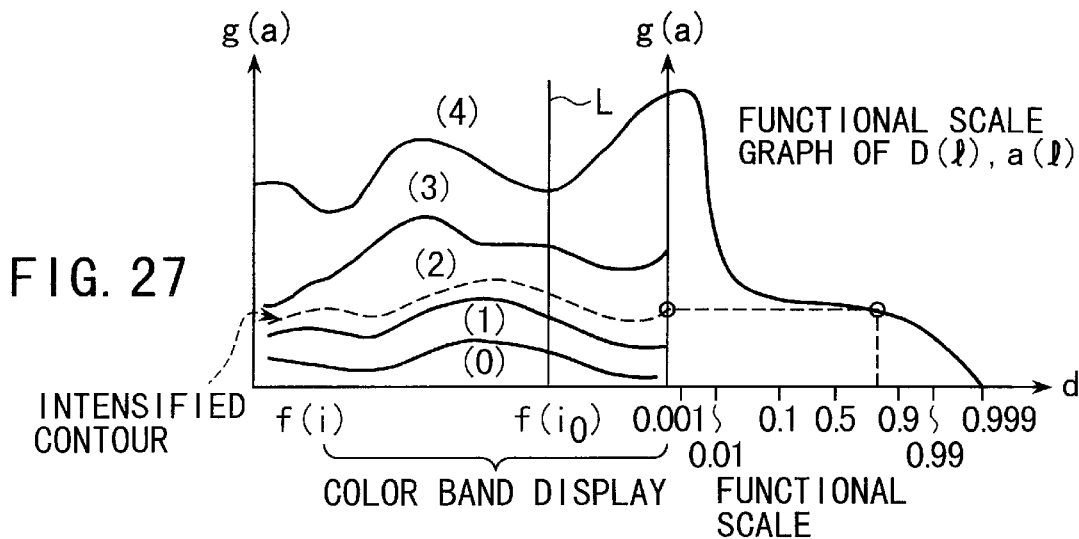
FIG. 27 is a diagram showing an example of the simultaneous display of the color band and the functional scale.

FIG. 27 shows an example of the simultaneous display of the color band and the functional scale.

In this case, $i_0 < j$ is designated to give $$\{1/(j - i_0 + 1)\} \sum_{i'=i_0}^{j} D_{i'}(l) = D(l) \tag{88}$$

or, $i_0$ is designated to give $$D_{i_0}(l) = D(l) \tag{89}$$

Then, as shown in FIG. 27, the functional scale is displayed with the ordinate representing g(a) and the abscissa representing $g(\eta_X^{-1}(D(l)))$ in the right half and the color band is displayed as . . . , $D_{j-3}$ $D_{j-2}$, $D_{j-1}$, $D_j$ in the left half of the display screen. As an alternative, the following color band is displayed.

$$\ldots, d_{i_0}-3, d_{i_0}-2, d_{i_0}-1, d_{i_0}, d_{i_0}+1, \tag{90}$$

In the former case, first, the cursor L is displayed at the position $i = i_0$.

Then, the relation $0 < d < 1$ is designated by a knob or key on the operating unit 211. In the process, the sole value l associated with the relation $D(l) \geq d > D(l+1)$ exists.

The value D(l) and a(l) on the functional scale are intensified, so that as shown in FIG. 27, a(l) and D(l) are numerically displayed.

In this case, the Y axis is scaled logarithmically, linearly or by power level.

Next, the value $l_i$ meeting the relation $D_i(l_i) \geq d > D_i(l_i+1)$ is searched for, where i is given as $i \leq j$. As shown in FIG. 27, the intensified contour of f(i), $a(l_i)$ is displayed.

Figure 28:
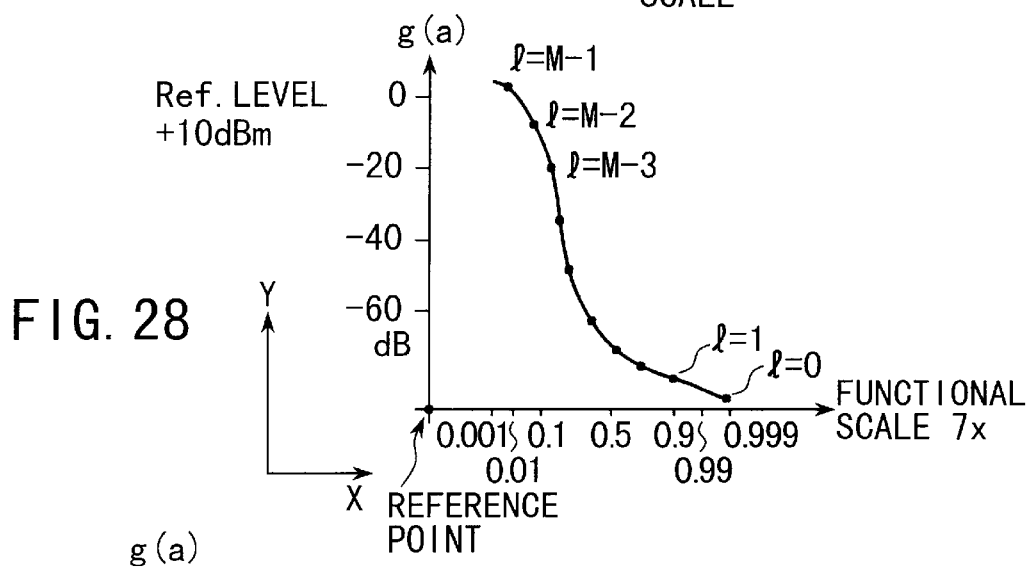
FIG. 28 is is a diagram showing a part of the functional scale graph.

FIG. 28 shows a portion of the functional scale graph.

This functional scale graph is expressed as $$(X, Y) = (g(\eta_X^{-1}(D(l))), g(a(l))) \tag{91}$$

In FIG. 28, X is the length from a reference point and is given as $g(\eta_X^{-1}(D(l)))$.

Also, the functional scale $\eta_X(\alpha)$ is a monotonie decreasing function of $\alpha$.

Now, another example of simultaneous display of color band and functional scale will be explained.

Figure 29:
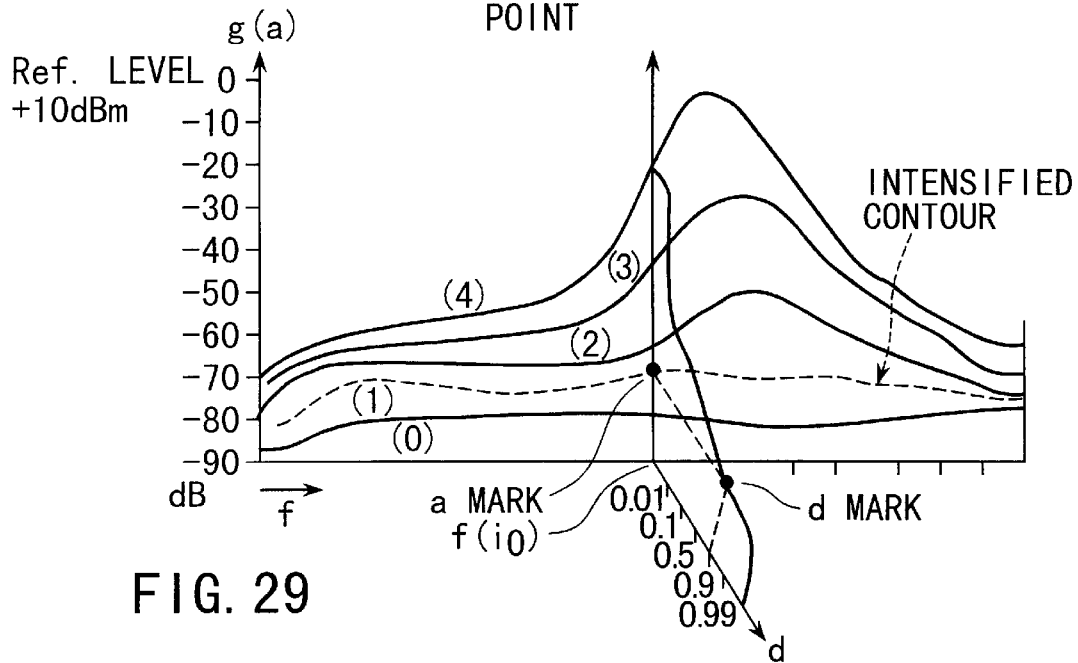
FIG. 29 is a diagram showing the color band functional scale simultaneous display mode according to another embodiment, in which the functional scale portion is plotted in a plane perpendicular to the plane of the color band and display.

FIG. 29 shows the case in which the functional scale portion is expressed in a plane perpendicular to the plane of the color band display portion as a form of simultaneous display of color band and functional scale according to another embodiment.

In a manner similar to the one described above, the relation $0 \leq d \leq -1$ is designated by a knob or a key. In this case, the sole l satisfying the relation $$D(l-1) \geq d > D(l) \tag{92}$$

exists.

And D(l) and a(l) are intensified on the functional scale, while $f(i_0)$ and a(l) are intensified on the color band.

Then, a(l) and D(l) are numerically displayed.

Also, for the value $l_i'$ meeting the relation $$D_i(l_i'-1) \geq d > D_i(l_i') \tag{93}$$

is determined, and the contour intensifying f(i) and $a(l_i')$ is displayed.

Figure 30:
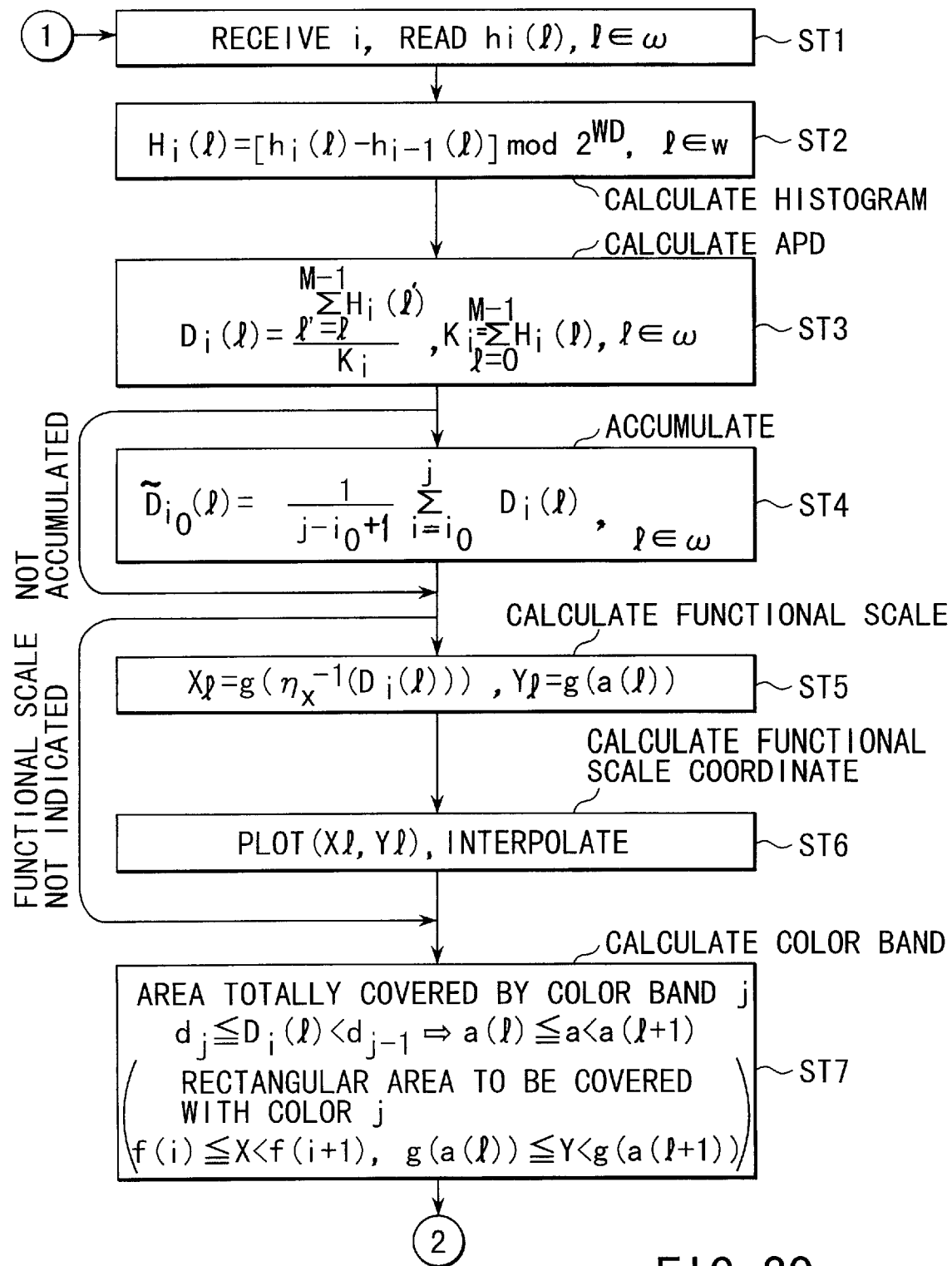
FIG. 30 is a flowchart for explaining the general operation of the invention.
Figure 31:
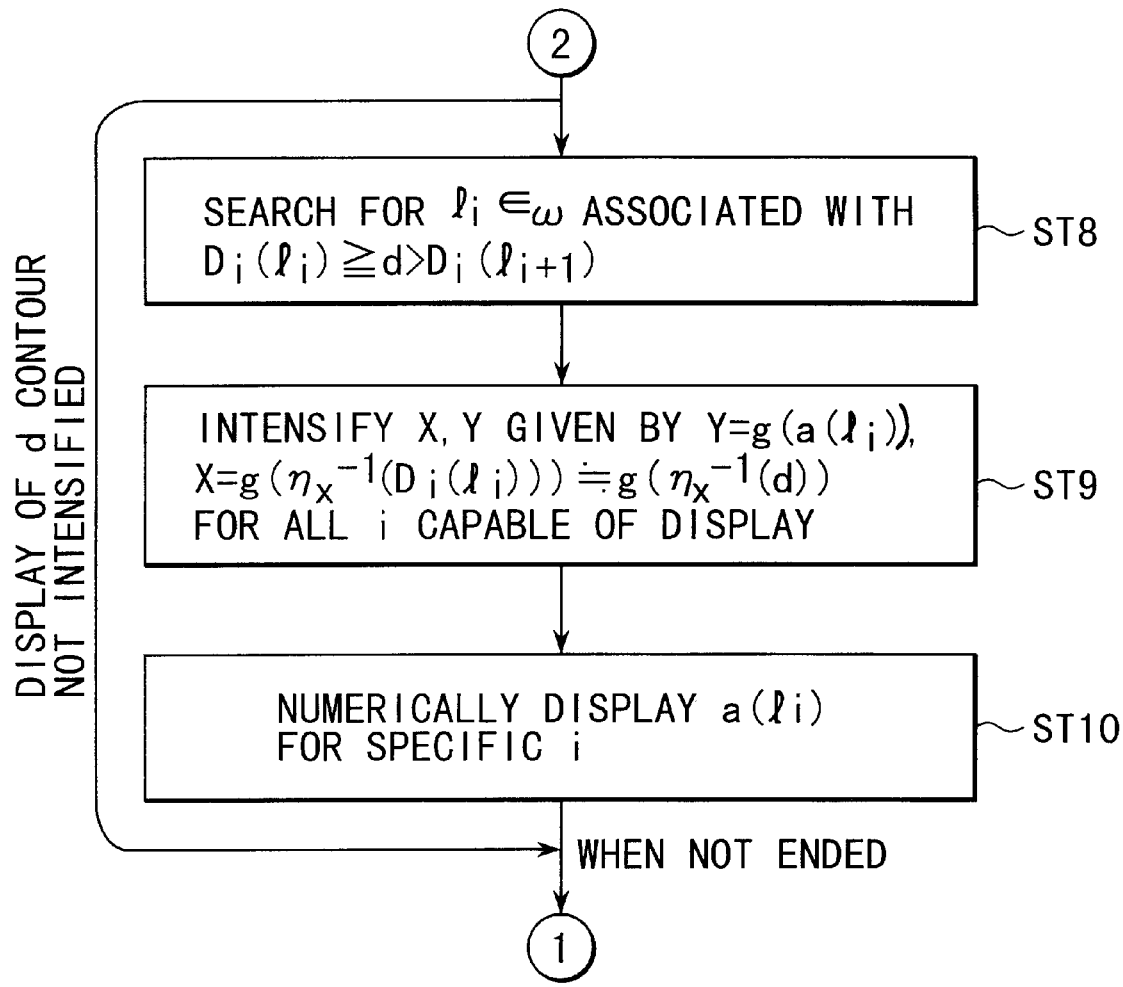
FIG. 31 is a flowchart for explaining the general operation of the invention.

FIGS. 30 and 31 are flowcharts for explaining the general operation of the invention described above.

Specifically, as shown in FIGS. 30 and 31, the arithmetic unit 208 receives the front end state number i in step ST1, and reads $$h_i(l), l \in \omega \tag{94}$$

from the memory 207 of the histogram measuring circuit 206.

Then, in step ST2, the histogram is calculated based on $$H_i(l) = \{h_i(l) - h_{i-1}(l)\} \bmod 2^{WD}, l \in \omega \tag{95}$$

Next, in step ST3, the APD is calculated based on $$D_i(l) = \left\{ \sum_{l'=l}^{M-1} H_i(l') \right\} / K_i, \tag{96}$$

$$K_i = \sum_{l=0}^{M-1} H_i(l),$$

$$l \in \omega$$

Then, in step ST4, the accumulation is calculated based on $$\tilde{D}_{i_0}(l) = \{1/(j - i_0 + 1)\} \sum_{i=i_0}^{j} D_i(l), \tag{97}$$

$$l \in \omega$$

Further, in step ST5, the functional scale is calculated based on $$X_l = g(\eta_X^{-1}(D(l))), Y_l = g(a(l)) \tag{98}$$

Then, in step ST6, the functional scale coordinate is calculated based on the plot of Xl, Yl and the interpolation.

Next, in step ST7, the area totally covered by the color band j is determined based on $$d_j \leq D_i(l) < d_{j-1} \rightarrow a(l) \leq a < a(l+1) \quad (99)$$

where j covers the whole color bands.

Here, a rectangular area to be covered by the color of j is expressed as $$f(i) \leq X < f(i+1), g(a(l)) \leq Y < g(a(l+1)) \quad (100)$$

Then, in step ST8, the value $l_i \in \omega$ satisfying the relation $$D_i(l_i) \geq d > D_i(l_i+1)$$

$$l_i \in \omega \quad (101)$$

is searched for.

Next, in step ST9, for all the values i that can be displayed based on $$Y = g(a(l_i)),$$

$$X = g(\eta_X^{-1}(D_i(l_i))) \approx g(\eta_X^{-1}(d)) \quad (102)$$

X and Y are intensified.

Then, in step ST10, a(li) for a specific i is numerically displayed.

After a predetermined number of processes is finished, the process is returned to step ST1, and the series of steps described above is repeated.

In the process described above, the range of $i_0$, d, j, $d_j$ is determined by the user. The relation $$a(l), l \in \omega \quad (103)$$

is determined at the time of calibration, the unit being $V_{RMS}$.

The values g, $p_X$ are selected by the user from a menu. The contents $$h_i(l), l \in \omega \quad (104)$$

are read from the memory 207.

X, Y represents a coordinate for display on the screen corresponding to the address of the video RAM not shown in the display controller 212.

$D_i(l)$ is an amount calculated from $h_i(l)$ and indicates APD of the threshold value a(l).

Now, an explanation will be given of a counter applicable in place of the histogram measuring circuit 206 including switches S1, S2 for switching the histogram measurement mode (inc) and the measurement result output mode (dump), a register 206b, a memory 207 and an interface circuit 206, as shown in FIG. 10.

(First Counter)

Figures 32, 33:
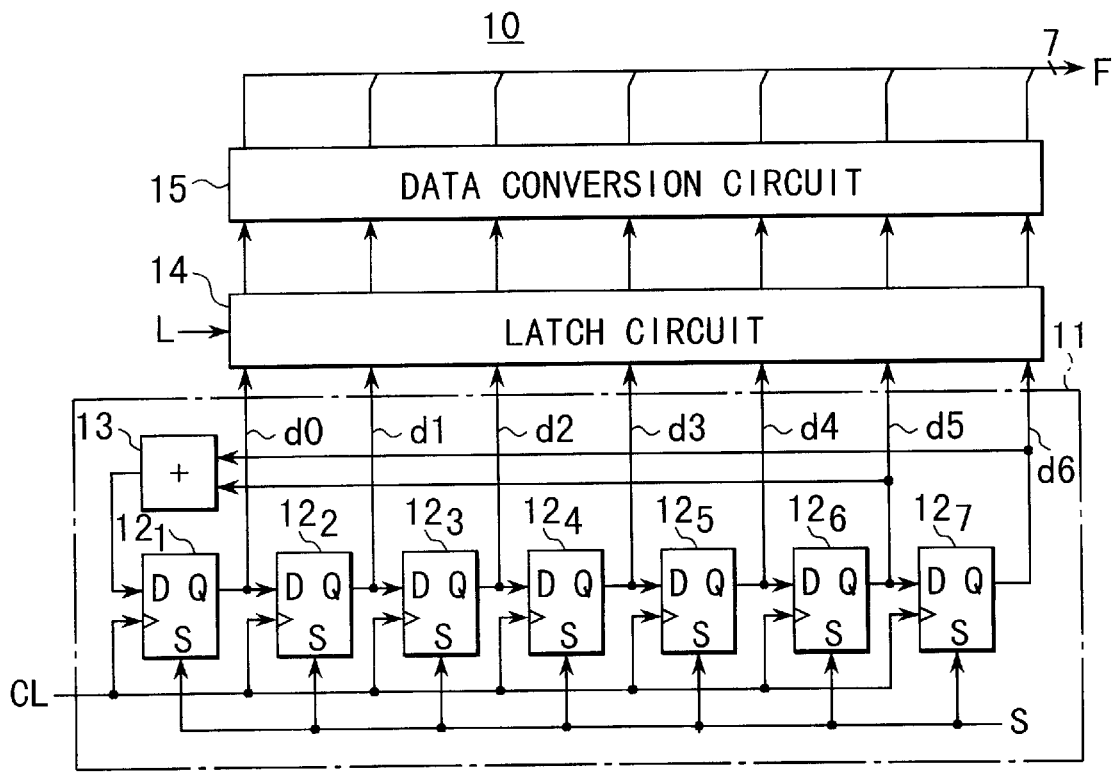
FIG. 32 is a block diagram showing another specific example of the histogram measuring circuit 206 of FIG. 1.
FIG. 33 is a diagram for explaining the operation of the circuit of FIG. 32.

FIG. 32 shows a configuration of a first counter 10 for high speed counting of a comparatively small number of bits.

The counter 10 includes a linear feedback counting circuit 11, a latch circuit 14 and a data conversion circuit 15.

The linear feedback counting circuit 11 has a configuration corresponding to a predetermined number of order of generating function, and the counting circuit 11 shown in FIG. 33 corresponds to the seventh-order primitive polynomial $(1+x+x^7)$.

The counting circuit 11 includes a linear feedback shift register circuit of Fibonacci configuration.

Specifically, seven D-type flip-flops $12_1$ to $12_7$ constitute a seven-stage shift register. The exclusive OR of the outputs of the flip-flops $12_6$, $12_7$ in sixth and seventh stages is fed back to the flip-flop $12_1$ in the first stage from an EXOR circuit 13, and the clock pulses to be counted are input in parallel to all the flip-flops $12_1$ to $12_7$.

Also, the set terminals of the flip-flops $12_1$ to $12_7$ are supplied with a set signal s for setting the outputs of the flip-flops $12_1$ to $12_7$ to the initial data in which all bits are 1.

In the counting circuit 11 having this configuration, as shown in FIG. 33, the initial data (all bits are 1 in this case) are preset to other than the state in which all bits are zero in the flip-flops $12_1$ to $12_7$. Then, the 7-bit output data d0 to d6 can assume any one of the values 1 to 127 without overlap in the range of 0 to 126 of the number F of clock pulses.

In this case, however, the number F of clock pulses CL, which fails to coincide with the output data, is converted into the number F of the clock pulses by the data conversion circuit 15 described later.

The 7-bit output data of the counting circuit 11 is latched in a latch circuit 14 that has received a latch signal L, and then output to the data conversion circuit 15.

The data conversion circuit 15 includes a memory in which the number F of pulses shown in FIG. 33 is stored in the addresses designated by corresponding output data, and outputs the number F of pulses corresponding to the output data latched in the latch circuit 14.

The set signal S applied to the counting circuit 11 and the latch signal L applied to the latch circuit 14 are supplied from a control circuit not shown.

In the counter 10 configured as described above, the number F of input clock pulses CL counted from immediately after the time point when the set signal S is input to the counting circuit 11 to the time point when the latch signal L is input to the latch circuit 14 is output from the data conversion circuit 15.

The first counter 10 is so configured that the linear feedback counting circuit for feeding back the output of the shift register circuit receives the clock signals to be counted and steps forward the output data, so that the output data thereof is converted into the data indicating the number of input clock pulses. Therefore, a high-speed clock signal counting operation is made possible without regard to the number of digits.

Although the foregoing description refers to the counting of seven digits, the counting circuit 11 can be configured to meet the requirement of a higher order of generating function. In that case, the counting of at least seven digits can be accomplished, and a counter capable of high speed counting up to about ten and several digits is realized with a simple configuration.

(Second Counter)

The first counter deals with a comparatively few number of digits and can be used for up to about ten and several digits. If more digits are involved, such as when an attempt is made to realize the counting of 26 bits with a counting circuit meeting the requirement of 26th-order generating function $(1+x+x^2+x^6+x^{26})$, for example, the memory capacity of the data conversion circuit 15 undesirably exceeds about 210 Mbytes. This is difficult to realize with a normal configuration of memory 207.

Now, a second counter capable of high-speed counting of a multiplicity of digits with a smaller memory capacity for data conversion will be explained.

In this counter, the clock signal is counted by a plurality of counting circuits corresponding to a plurality of primitive polynomials of such an order that values $(2^{ni}-1)$ equivalent to the power of 2 less 1 are unique to each other and the total sum $(n1+n2+\ldots+nr)$ thereof is equal to 26 thereby to reduce the memory 207 capacity for data conversion.

In the case of this division, however, the number of clock pulses cannot be acquired directly from the data converted in the data conversion circuit. As described above, however, the fact that the values equivalent to the power of 2 of the number of bits of each divided data, less 1, are relatively prime integer makes it possible to acquire the number of clock pulses according to a method called the residue number systems or the Chinese remainder theorem.

Figure 34:
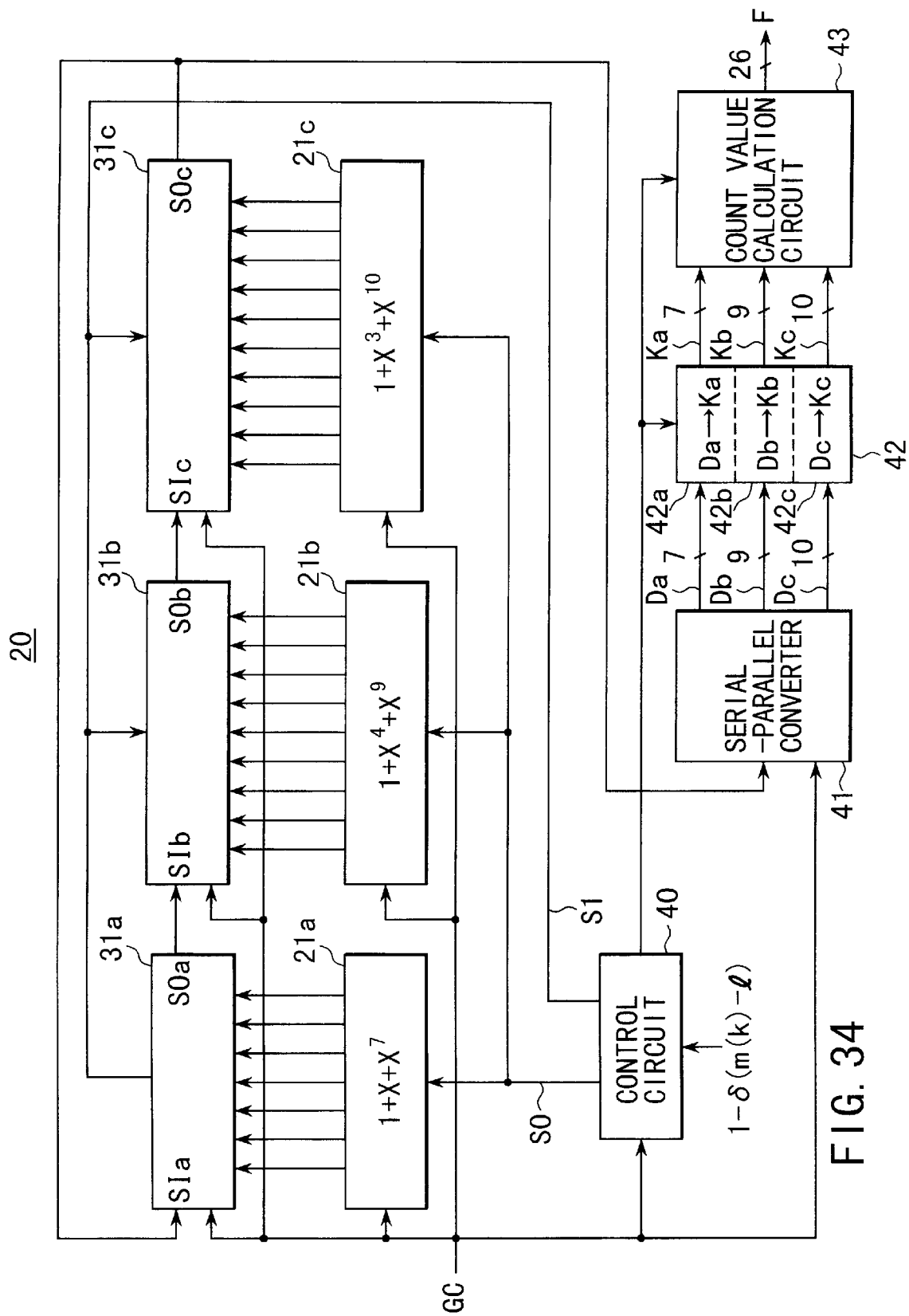
FIG. 34 is a block diagram showing still another specific example of the histogram measuring circuit 206 in FIG. 1.

FIG. 34 shows a configuration of the second counter 20.

This counter 20 includes linear feedback counting circuits 21a to 21c corresponding to the 7th-order (n1=7), 9th-order (n2=9) and 10th-order (n3=10) primitive polynomials for realizing a high-speed counting operation of 26 bits, three latch circuit 31a to 31c corresponding to the counting circuits 21a to 21c, respectively, a control circuit 40, a serial-parallel conversion circuit 41, a data conversion circuit 42 and a count arithmetic processing circuit 43.

Figure 35:
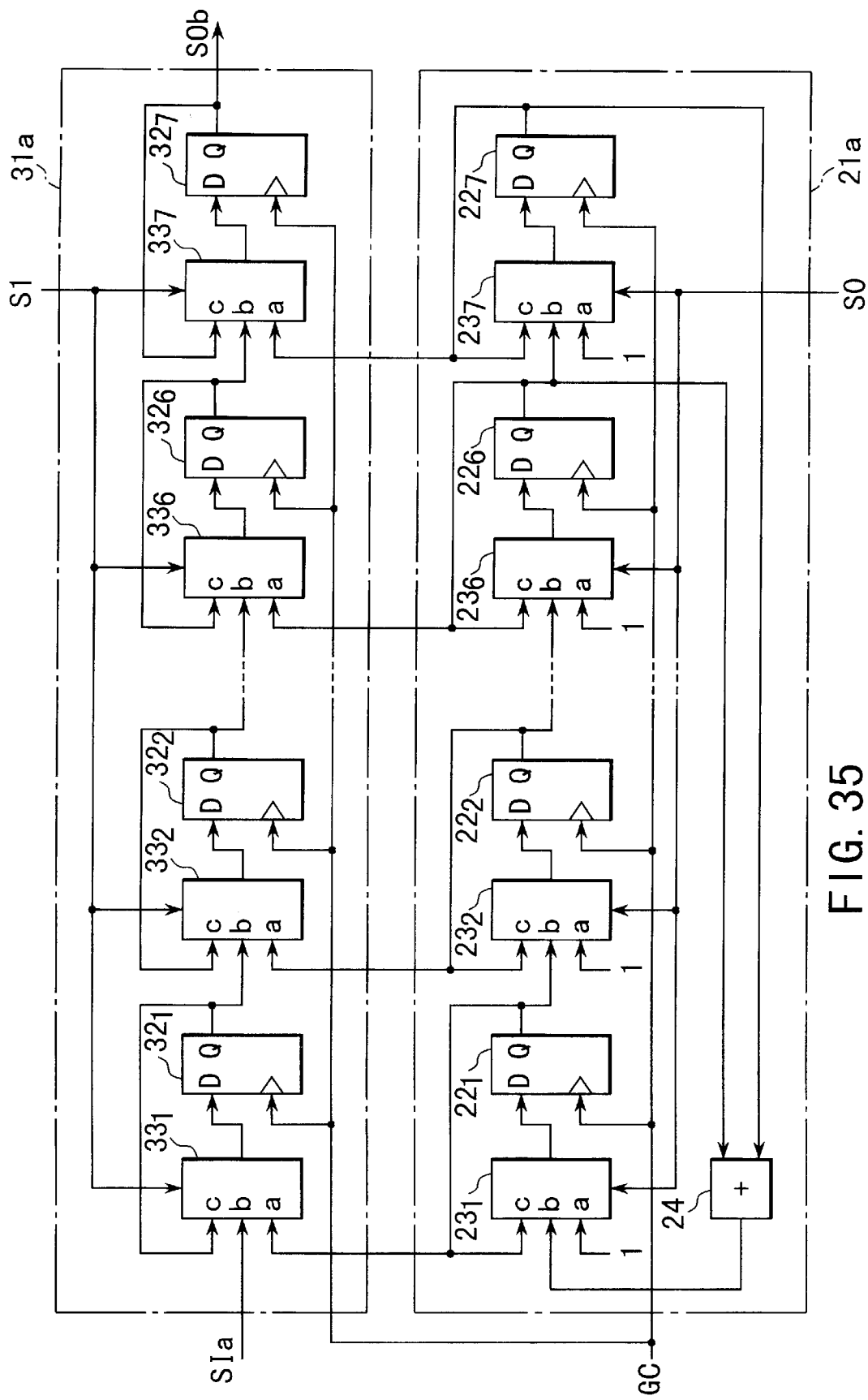
FIG. 35 is a block diagram showing a configuration of the essential parts of FIG. 34.

FIG. 35 shows the internal configuration of the counting circuit 21a and the latch circuit 31a.

The counting circuit 21a includes D-type flip-flops $22_1$ to $22_7$ making up a 7-stage shift register circuit corresponding to the 7th-order primitive polynomial $(1+x+x^7)$, multiplexers $23_1$ to $23_7$ and an EXOR circuit 24.

The clock terminals of the flip-flops $22_1$ to $22_7$ each are connected in parallel to global clock GC, and each D terminal is connected with the multiplexers $23_1$ to $23_7$.

The multiplexers $23_1$ to $23_7$ each have three input terminals a to c.

The first input terminal a is supplied with the data of bits (all 1 in this case) for initialization.

The second input terminal b, on the other hand, is a counting terminal supplied with a Q output of the flip-flop of the preceding stage.

The third input terminal c is for holding, and is supplied with the output of the flip-flop connected thereto.

The multiplexers $23_1$ to $23_7$ connect the D terminals of the flip-flops with the first input terminal a when the 2-bit mode signal So output from the control circuit 40 is (00), with the second input terminal b when the mode signal So is (10), and with the third input terminal c when the mode signal So is (11).

The outputs of the sixth-stage and seventh-stage flip-flops $22_6$, $22_7$ are input to the EXOR circuit 25, and the exclusive OR of the two is input to the second input terminal b of the multiplexer $23_1$.

The latch circuit 31a, on the other hand, includes seven D-type flip-flops $32_1$ to $32_7$ for latching the outputs of the flip-flops $22_1$ to $22_7$ of the counting circuit 21a, and multiplexers $33_1$ to $33_7$.

The clock terminals of the flip-flops $32_1$ to $32_7$ are supplied with the global clock GC in parallel as transfer clock signals, and each data terminal is connected with the multiplexers $33_1$ to $33_7$.

The multiplexers $33_1$ to $33_7$ each include three input terminals a to c.

The first input terminal a is a load terminal supplied with the outputs of the flip-flops $22_1$ to $22_7$ of the counting circuit 21a.

The second input terminal b is a transfer terminal supplied with the output of the flip-flop of the preceding stage.

The third input terminal c, on the other hand, is a hold terminal supplied with the output of the flip-flop connected therewith.

The multiplexers $33_1$ to $33_7$ connect the D terminals of the flip-flops with the first input terminal a when the mode signal S1 of the 2 bits output from the control circuit 40 is (00), with the input terminal b when the mode signal S1 is (10), and with the third input terminal c when the mode signal S1 is (11).

Figure 36:
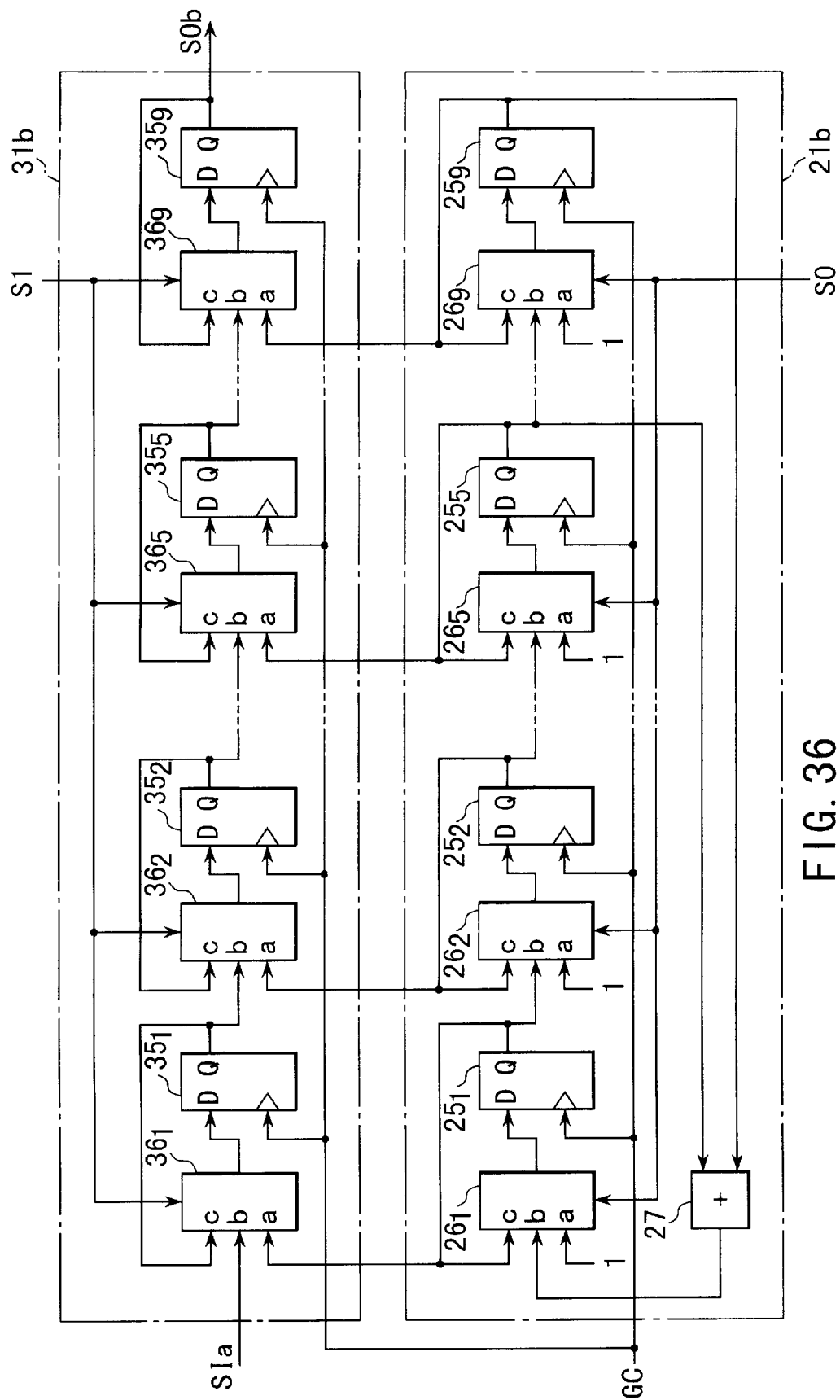
FIG. 36 is a block diagram showing a configuration of the essential parts of FIG. 34.

Also, as shown in FIG. 36, the counting circuit 21b corresponding to the 9th-order primitive polynomial $(1+x^4+x^9)$ includes nine flip-flops $25_1$ to $25_9$, multiplexers $26_1$ to $26_9$ each having three input terminals a to c and an EXOR circuit 27. The latch circuit 31b, on the other hand, includes nine flip-flop $35_1$ to $35_9$, and multiplexers $36_1$ to $36_9$ having three input terminals a to c.

In this counting circuit 21b, the outputs of the flip-flops $25_5$, $25_9$ in the fifth and ninth stages corresponding to the 9th-order primitive polynomial $(1+x^4+x^9)$ are applied to the EXOR circuit 27, and the exclusive OR of the two is applied to the second input terminal b of the multiplexer $26_1$.

Figure 37:
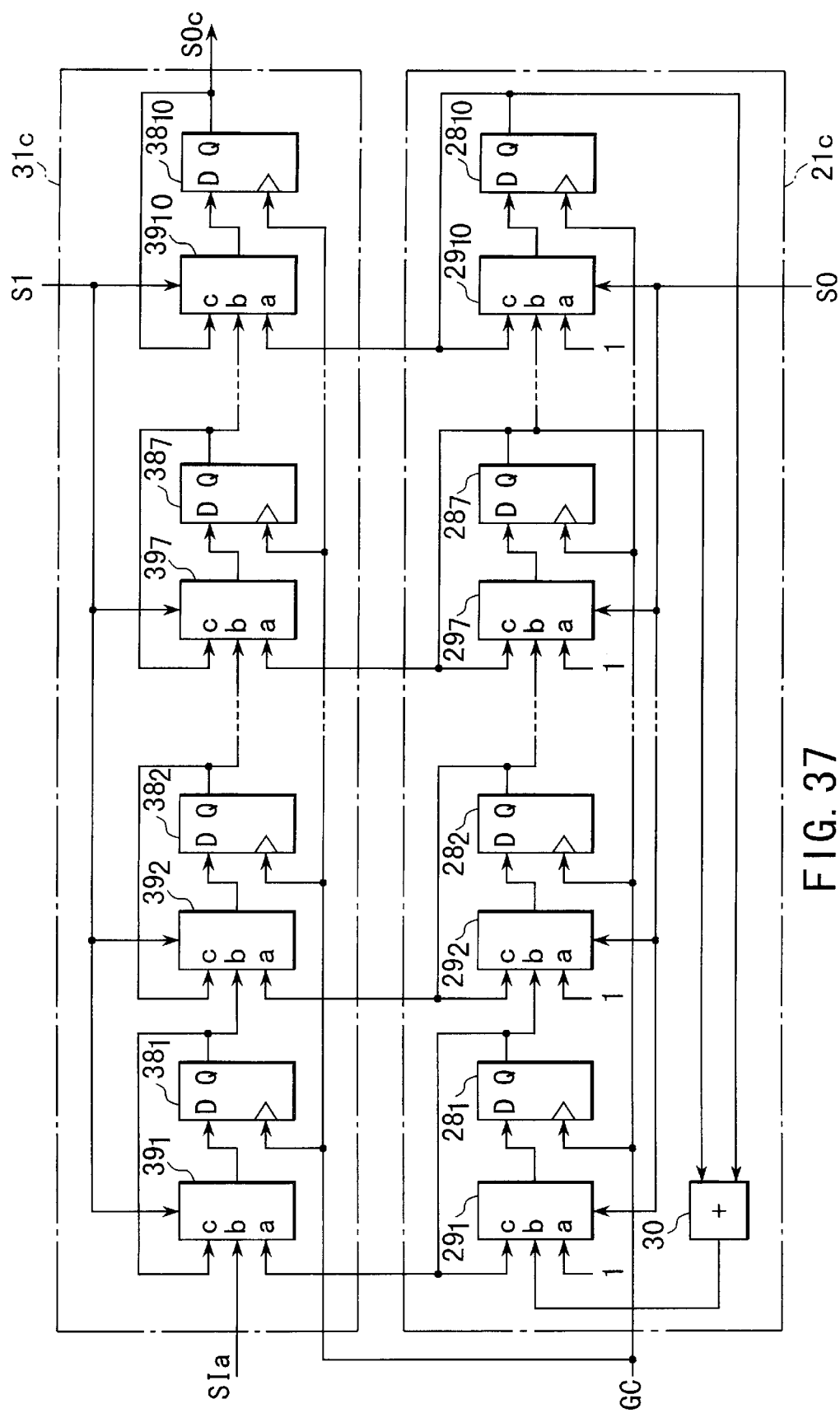
FIG. 37 is a block diagram showing a configuration of the essential parts of FIG. 34.

In similar fashion, as shown in FIG. 37, the counting circuit 21c corresponding to the 10th-order primitive polynomial $(1+x^3+x^{10})$ includes ten flip-flops $28_1$ to $28_{10}$, multiplexers $29_1$ to $29_{10}$ each having three input terminals a to c, and an EXOR circuit 30. The latch circuit 31c, on the other hand, includes ten flip-flops $38_1$ to $38_{10}$ and multiplexers $39_1$ to $39_{10}$ each having three input terminals a to c.

In the counting circuit 21c, the outputs of the flip-flops $28_7$, $28_{10}$ in the 7th and 10th stages corresponding to the 10th-order primitive polynomial $(1+x^3+x^{10})$ are applied to the EXOR circuit 30, and the exclusive OR of the two is input to the second input terminal of the multiplexer $29_1$.

Also, the serial output S0a (the output of the flip-flop $32_7$) of the latch circuit 31a is input to the serial input S1b (the second input terminal 36b of the multiplexer $36_1$) of the latch circuit 31b.

The serial output S0b (the output of the flip-flop $35_7$) of the latch circuit 32a, on the other hand, is input to the serial input S1b (the second input terminal 39b of the multiplexer $39_1$) of the latch circuit 31c.

The control circuit 40, when turning on a power supply, as shown in FIG. 38A, sets the mode signal S0 to (00), inputs (1) to all the flip-flops of the counting circuits 21a to 21c, and sets the data to the initial state of all 1 bits in response to the global clock GC.

After initialization, the mode signal S0 is set to (10) for the mode signal S0 is (10), during only a time interval that the ADC output code m(k) in kth clock is a specific value l, and the counting circuits 21a to 21c are caused to count the global clock GC. After the lapse of the m(k)≠l, the mode signal SO is set to (11) and the counts Da to Dc of the counting circuits 21a to 21c can be held. That is to say, the second bit of the mode signal S0 coincides 1−δ(m(k)−l).

Also, during this counting operation (without stopping the global clock GC), as shown in FIG. 38B, the mode signal S1 is set to (00), and the count of the counting circuits 21a to 21c is applied to all the flip-flops of the latch circuits 31a to 31c, and stored in the latch circuits 31a to 31c by one clock signal CL.

Then, the mode signal S1 is then set to (10) and the counts Da, Db, Dc stored in the latch circuits 31a to 31c are output serially (26 clock signals are required in this case).

The counting circuits 21a to 21c and the latch circuits 31a to 31c hold the data by applying the Q outputs of the flip-flops to the D terminals of the flip-flops by the multiplexers. Therefore, the global clock GC can be kept supplied.

Also, since the latch circuits 31a to 31c are all connected in circulation, the counts can be transferred any number of times until the next counting result is latched.

The data output from the latch circuits 31a to 31 c are restored to the parallel data Da, Db, Dc by the serial-parallel conversion circuit 41, and supplied to the data conversion circuit 42.

The data conversion circuit 42 includes first to third memories 42a, 42b, 42c corresponding to the counting circuits 21a to 21c, respectively.

The first memory 42a has stored therein the data Ka (0 to 126) indicating the number of steps advanced until the counting result Da is reached from the initial data, at the address designated by the counting result Da of the counting circuit 21a. The data Ka corresponding to the data Da from the serial-parallel conversion circuit 41 is output.

The second memory 42b has stored therein the data Kb (0 to 510) indicating the number of steps advanced until the counting result Db is reached from the initial data, at an address designated by the counting result Db of the counting circuit 21b. The data Kb corresponding to the data Db from the serial-parallel conversion circuit 41 is output.

The third memory 42c has stored therein the data Kc (0 to 1022) indicating the number of steps advanced until the counting result Dc is reached from the initial data, at the address designated by the counting result Dc of the counting circuit 21c. The data Kc corresponding to the data Dc from the serial-parallel conversion circuit 41 is output.

On case that $\delta(m(k)-l)=1$ is continued, the relation between the number F of the global clock pulses to the counting circuits 21a to 21c and the output values Ka, Kb, Kc of the memories 42a to 42c is shown in FIGS. 39A to 39D.

In FIG. 39A to 39D, as described above, $127 (=2^7-1)$, $511 (=2^9-1)$, $1023 (=2^{10}-1)$ are unique to each other. It is therefore in the range of 0 to 126 where the values Ka, Kb, Kc output from the first to third memories 42a, 42b, 42c are equal to each other.

In the case where the relation holds that Ka=Kb=Kc in this range, therefore, it follows that the particular value represents the actual number F of global clock pulses.

When the number F of pulses exceeds 126, however, the true number F of the pulses cannot be determined directly from the values Ka, Kb, Kc output from the memories 42a to 42c.

In view of this, in the second counter 20, the values Ka, Kb, Kc output from the memories 42a to 42c are applied to a count processing circuit 43, so that the actual number F of pulses is determined according to a method called the residue number systems or the Chinese remainder theorem.

In the process, the range of F is between 0 and 66389630 ($=127 \times 511 \times 1023 - 1$) inclusive.

Accordingly, the following equation (105) can be counted on a time t from the time of S0=(00).

$$\left\{ \sum_{k=0}^{\lfloor t/T_s \rfloor} \delta(m(k)-l) \right\} \bmod 127 \times 511 \times 1023 = F_l(\lfloor t/T_s \rfloor) \quad (105)$$

where $T_s$ is a period of the global clock GC and, similar to the sampling period of the ADC.

Now, a Garner scheme providing a process of the method called the residue number systems or the Chinese remainder theorem will be explained.

Specifically, the count processing circuit 43 has stored therein the values of $m1=2^7-1$, $m2=2^9-1$, $m3=2^{10}-1$, the values of $m1 \cdot m2$, $m1 \cdot m2 \cdot m3$ and the three coefficients Uij (i<j) satisfying the following congruence expression (106)

$$Uij \cdot mi \equiv 1 (\bmod mj) \quad (106)$$

where (mod y) shows the remainder after dividing the calculation result by y.

According to the following recursion formula, Va, Vb, Vc are calculated from Ka, Kb, Kc.

Va=Ka,

Vb=(Kb−Va)U12 mod m2,

Vc={(KC−Va)U13−Vb}U23mod m3 (107)

Then, the number $F_l(\lfloor t/T_s \rfloor)$ is determined by the operation of equation (108) below.

$$F=(Va+m1 \ Vb+m1 \cdot m2 \ Vc) \bmod m1 \cdot m2 \cdot m3 \quad (108)$$

The count processing circuit 43 processes the values Ka, Kb, Kc output from the memories 42a to 42c according to equation (2) above and thus determines the actual number $F_l(\lfloor t/T_s \rfloor)$.

As described above, $2^7-1(=127)$, $2^9-1(=511)$ and $2^{10}-1 (=1023)$ are relatively prime integers. Therefore, the data in the number of $(2^7-1) \cdot (2^9-1) \cdot (2^{10}-1)$, that is, 6638963 can be output from the counting circuits 21a to 21c.

This is larger than the maximum count $5 \times 10^7$ obtained when counting the clock signal of 20-nanosecond period for one second, as described above.

In addition, the capacity required of the memories 42a to 42c of the data conversion circuit 42 is 15718 ($=(7 \times 127)+(9 \times 511)+(10 \times 1023)$) bits or only about 16 K bits.

In this way, in the second counter 20, the clock signals are counted in parallel by a plurality of linear feedback counters corresponding to a plurality of primitive polynomials having such a number of order that the values ($2^{ni}-1$) equivalent to the power of 2 less 1 are relatively prime integers, and the total sum thereof (n1+n2+ . . . +nr) is equal to 26. The result of counting is data converted, and the actual number of global clock pulses are determined from the value thus data converted. As a result, like the first counter 10, the clock signals can be counted at high speed without regard to the number of digits. In addition, a multiplicity of digits can be counted with a small memory capacity.

Also, all the counting circuits 21a to 21c use a primitive polynomial having a minimum number of terms expressed as $(1+x^P+x^Q)$, and therefore the actual circuit configuration can be simplified (with a fewer number of EXOR circuits).

Although the second counter 20 refers to the case of counting 26 bits, the number of bits can be increased.

When counting 30 bits, for example, the counting circuits, the latch circuits and the data conversion circuits corresponding to the 9th-order primitive polynomial $(1+x^4+x^9)$, 10th-order primitive polynomial $(1+x^3+x^{10})$ and the 11th-order primitive polynomial $(1+x^2+x^{11})$ are used.

Also, the latch circuits 31a to 31c of the second counter 20 constitute a shift register circuit so that the latched count may be output serially. An expansion is possible, therefore, to count the clock signals from a plurality of routes in parallel.

Figure 40:
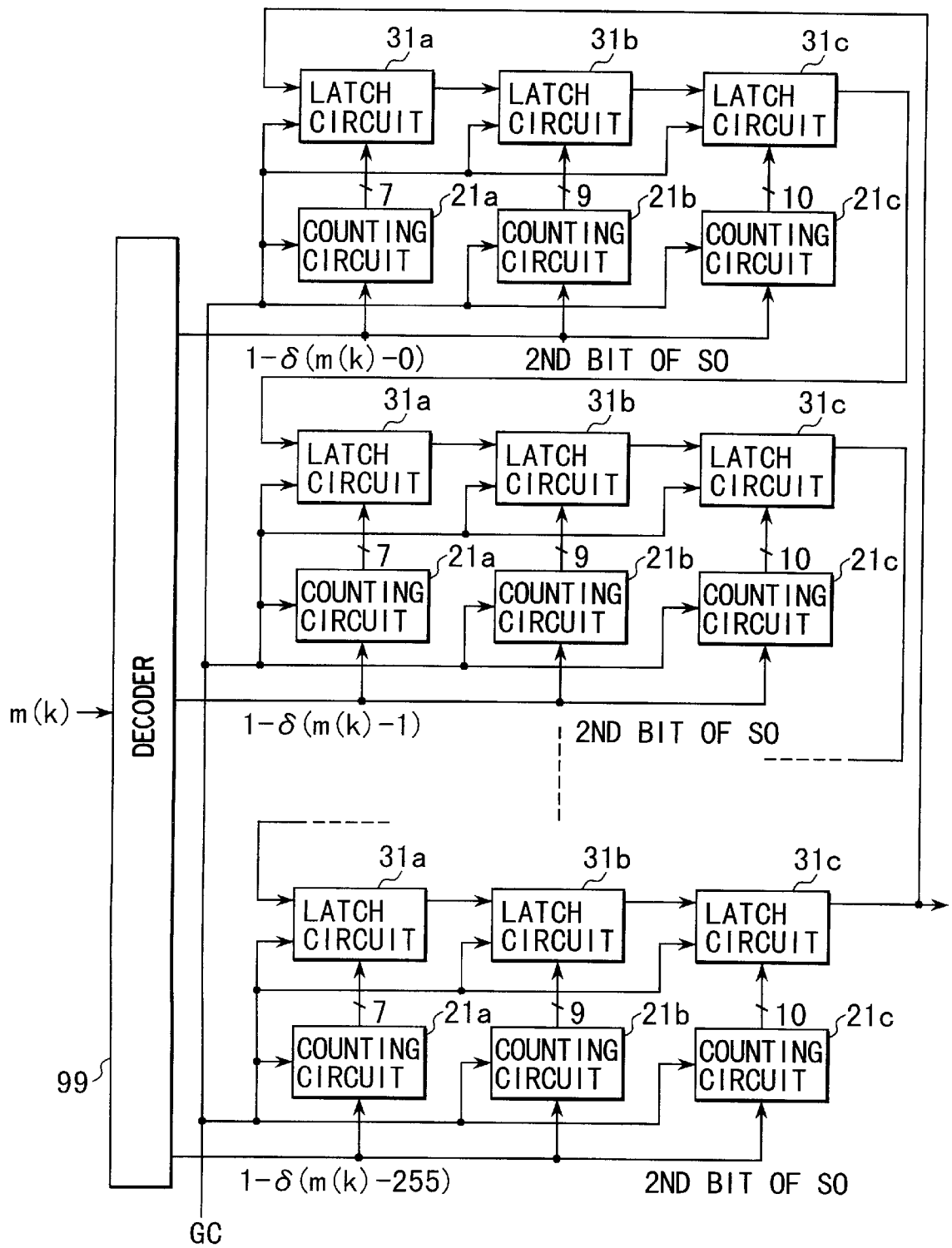
FIG. 40 is a block diagram showing a configuration for parallel counting of a plurality of events.

Specifically, as shown in FIG. 40, in order to count $$\sum_{k=0}^{\lfloor t/T_s \rfloor} \delta(m(k)-l), l \in \omega,$$

there are provided M sets of the counting circuits 21a to 21c and the latch circuits 31a to 31c. At the same time, all the sets of the latch circuits 31a to 31c are connected in series. Then, the counting result $F_l(\lfloor t/T_s \rfloor)$ for each l can be output from only one signal line of the latch circuit 31a to 31c constituting a set. This counting result is output to the serial-parallel conversion circuit 41, where the data conversion is effected in similar fashion to the foregoing case. Thus, the $F_f(\lfloor t/T_s \rfloor)$ is counted for each output of decoder 99.

Also, in this case, as shown in FIG. 40, as long as the latch circuits 31a to 31c of each set are connected in circulation as a whole, each counting result can be transferred as many times as desired.

In the second counter 20, the data latched in the latch circuit are serially output in synchronism with the clock signal to be counted. As an alternative to this, the transfer clock signal is input from a control circuit, so that the latch data are output asynchronously with the clock signal to be counted.

Also, instead of setting the initial data through the multiplexers in the flip-flops of the counting circuit, the initial data can be set by directly inputting the set signal to the flip-flops as in the first counter 10 without the intermediary of the multiplexers.

Figure 41:
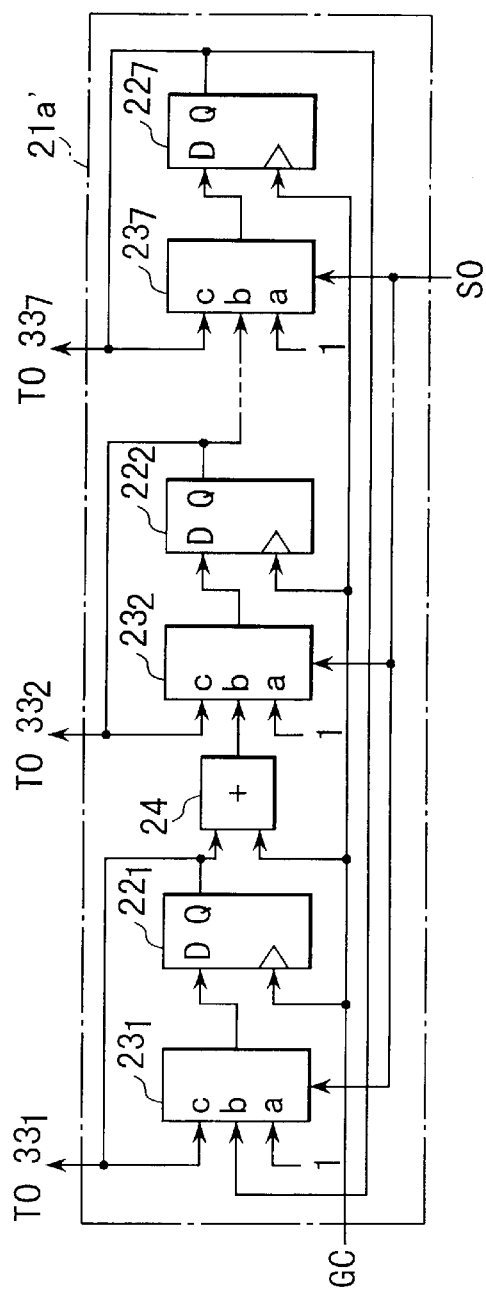
FIG. 41 is a block diagram showing a modification of the counting circuit.
Figure 42:
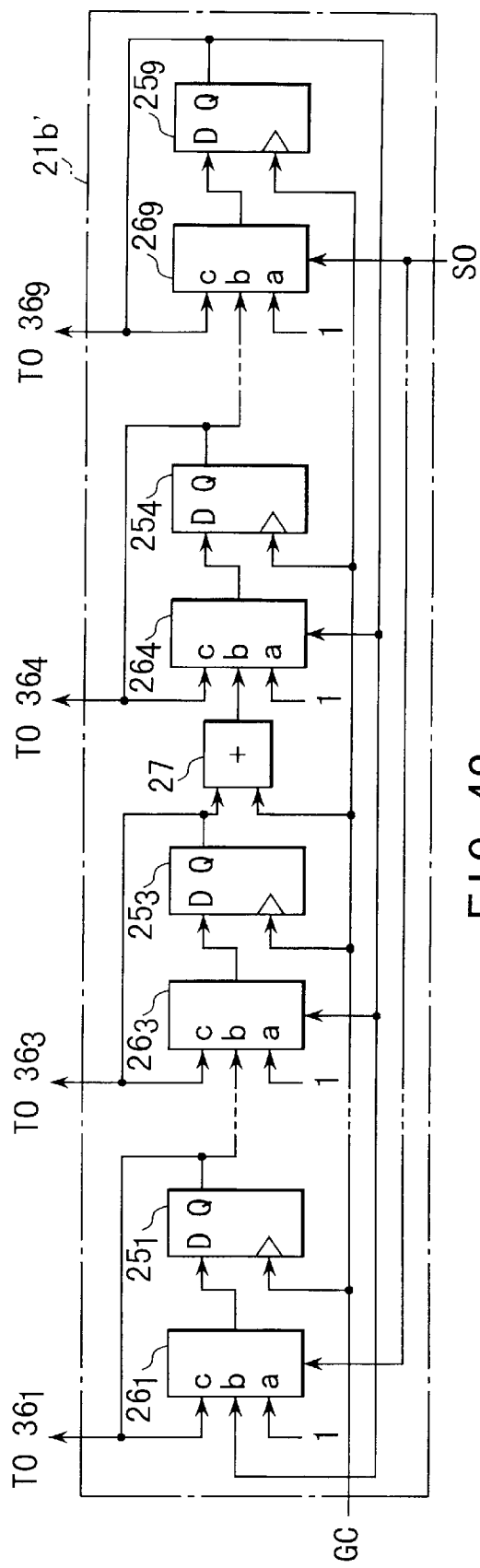
FIG. 42 is a block diagram showing a modification of the counting circuit.
Figure 43:
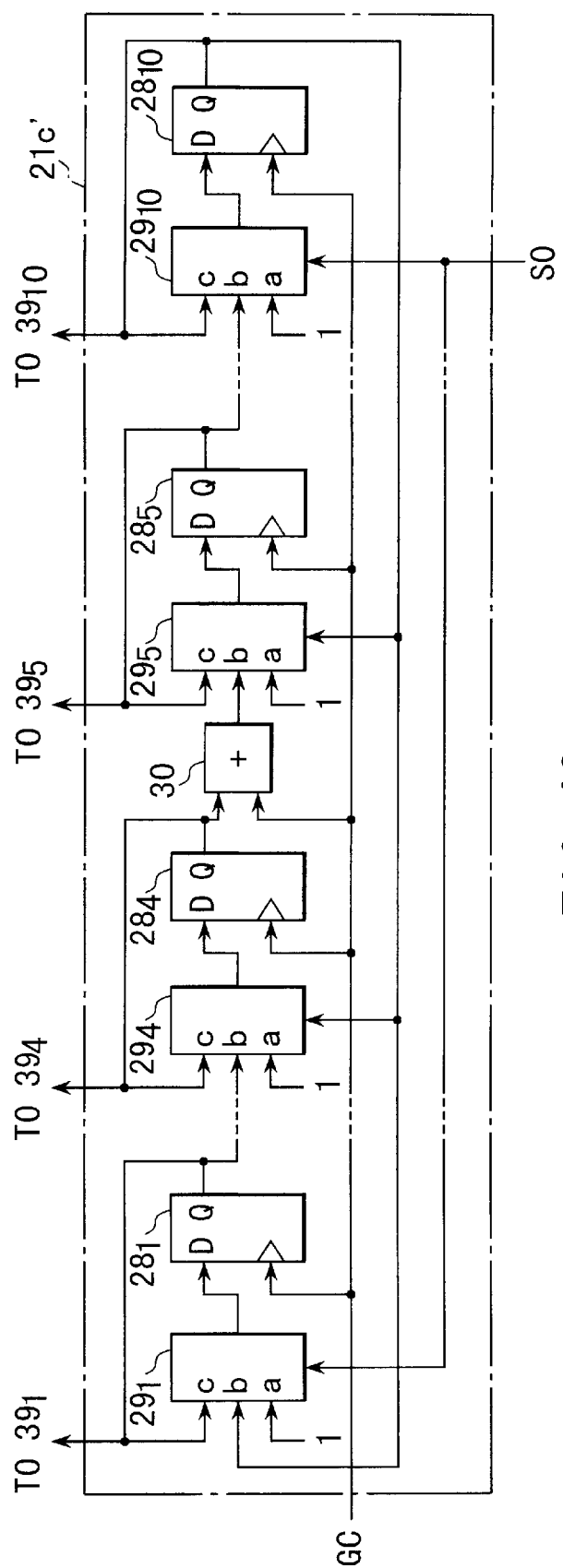
FIG. 43 is a block diagram showing a modification of the counting circuit.
Figure 44:
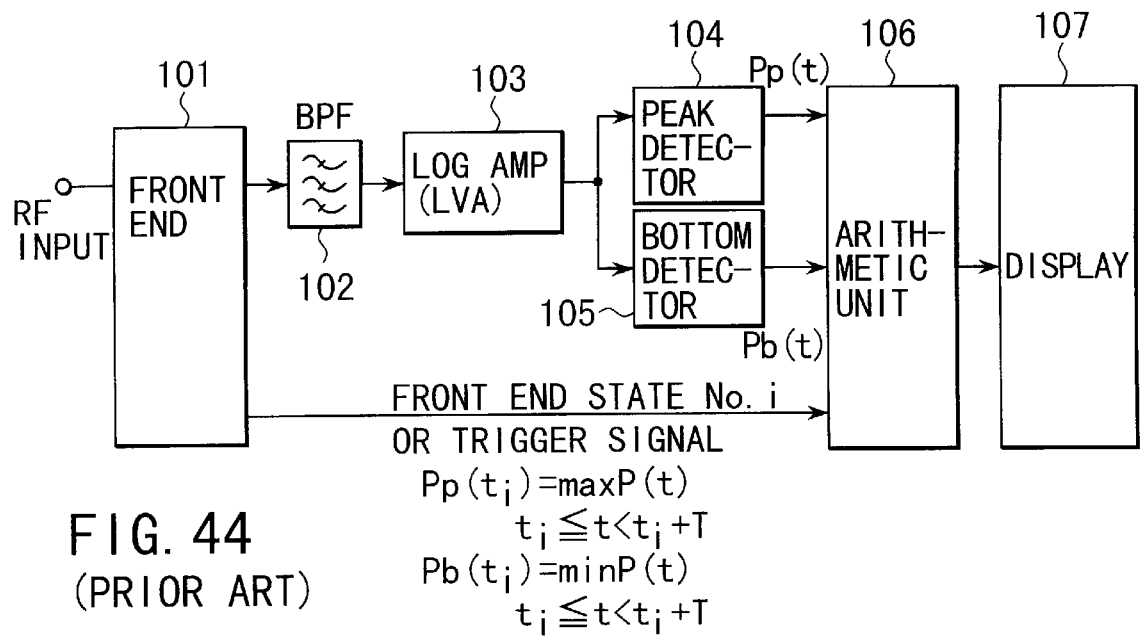
FIG. 44 is a block diagram showing a general configuration of a conventional spectrum analyzer constituting a disturbance field strength measuring apparatus for statistically evaluating the electromagnetic environment.
Figure 45:
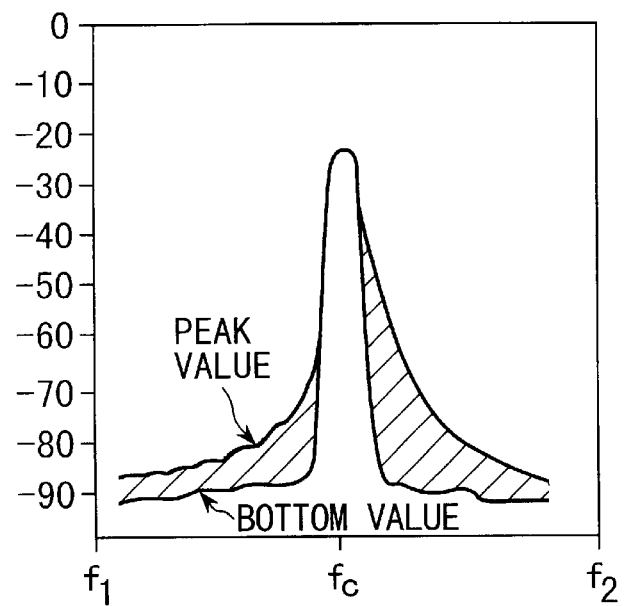
FIG. 45 is a diagram showing an example display in the display unit 107 of the conventional spectrum analyzer.

Further, in place of using the linear feedback shift register circuit connected in Fibonacci series as a counting circuit, a linear feedback shift register connected in Galois series can be configured like the counting circuits 21a', 21b', 21c' shown in FIGS. 41, 42, 43.

In the Galois series connection, the sequence of the tap positions (outputs applied to the EXOR circuit) is inverse to those in Fibonacci connection. Thus, the output of the final stage is applied to the first stage and one of the input terminals of the EXOR circuits 24, 27, 30, and the outputs of predetermined stages other than the first stage and the final stage are applied to the other input terminal of the EXOR circuits 24, 27, 30, of which the outputs are input to a predetermined next stage.

In the counter described above, the clock pulses to be counted is received and the output data are shifted in steps by the linear feedback counting circuit for feeding back the output of a plurality of stages of shift registers through an exclusive OR circuit, and the output data are converted to the data indicating the number of steps to be shifted. Therefore, the clock signal can be counted at high speed without being limited by the number of digits.

Also, the $F_f(\lfloor t/T_s \rfloor)$ are counted in parallel by a plurality of linear feedback counting circuits corresponding to a plurality of generating functions having the number of order in which the values ($2^{ni}-1$) equivalent to the power of 2 less 1 are relatively prime integers, the output data are converted into data indicating the number of steps shifted, and the $F_f(\lfloor t/T_s \rfloor)$ is determined from the converted value. In this way, the high-speed counting of a multiplicity of digits can be easily realized with a smaller memory capacity for data conversion.

It will thus be understood from the foregoing description that according to this invention, there is provided a spectrum analyzer having the function of effectively displaying the APD to solve the problem of the prior art by employing the identification display method.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A spectrum analyzer comprising:

signal receiving and processing means for receiving an input signal in accordance with desired frequency sweep information;

sampling means for sampling an output signal output from said signal receiving and processing means in accordance with a plurality of threshold values and outputting a plurality of output codes corresponding to sample values of an envelope of said input signal;

histogram measuring means for measuring a group of histograms corresponding to said output codes output from said sampling means;

arithmetic means for calculating an amplitude probability distribution of said output signal based on said histogram group measured by said histogram measuring means and said desired frequency sweep information, and classifying said amplitude probability distribution into a group of bands having a plurality of ranges corresponding to said histogram group; and display means for displaying said bands having said ranges calculated by said arithmetic means as an area for display in different states;

wherein said arithmetic means includes: (i) means for calculating a functional scale of said amplitude probability distribution in such a manner that, when said input signal is thermal noise according to a Rayleigh distribution, points corresponding to components of the thermal noise are plotted in line, and (ii) means for interpolating intermediate points between said plotted points; and wherein said display means displays said band group having the plurality of the ranges as an area in different states and the functional scale of the band group having the plurality of the ranges, and further displays a functional scale graph on which the points corresponding to the components of the thermal noise are plotted in line with a horizontal axis of the graph representing time ratios and a vertical axis representing amplitudes.

2. A spectrum analyzer according to claim 1, wherein said arithmetic means includes means for accumulating and averaging said amplitude probability distribution.

3. A spectrum analyzer according to claim 1, wherein said display means includes means for displaying said group of bands having the plurality of ranges in different color bands.

4. A spectrum analyzer according to claim 1, wherein said histogram measuring means includes a memory having a plurality of said output codes as addresses output from said sampling means, a switch for switching between a histogram measurement mode and a measurement output mode, an adder for adding +1 to an output of said memory in said histogram measurement mode, a register for returning an output of said adder to said memory, and an interface circuit for producing an output of said memory as the histogram measurement in said measurement output mode.

5. A spectrum analyzer comprising:

signal receiving and processing means for receiving an input signal in accordance with desired frequency sweep information;

sampling means for sampling an output signal output from said signal receiving and processing means in accordance with a plurality of threshold values and outputting a plurality of output codes corresponding to sample values of an envelope of said input signal;

histogram measuring means for measuring a group of histograms corresponding to said output codes output from said sampling means;

arithmetic means for calculating an amplitude probability distribution of said output signal based on said histogram group measured by said histogram measuring means and said desired frequency sweep information, and classifying said amplitude probability distribution into a group of bands having a plurality of ranges corresponding to said histogram group; and display means for displaying said bands having said ranges calculated by said arithmetic means as an area for display in different states;

wherein said arithmetic means includes means for intensifying a contour of a desired value of said amplitude probability distribution, and wherein said display means includes means for displaying said group of bands having the plurality of ranges as an area for display in different states and intensifying a display of the contour of the desired value of said amplitude probability distribution.

6. A spectrum analyzer comprising:

signal receiving and processing means for receiving an input signal in accordance with desired frequency sweep information;

sampling means for sampling an output signal output from said signal receiving and processing means in accordance with a plurality of threshold values and outputting a plurality of output codes corresponding to sample values of an envelope of said input signal;

histogram measuring means for measuring a group of histograms corresponding to said output codes output from said sampling means;

arithmetic means for calculating an amplitude probability distribution of said output signal based on said histogram group measured by said histogram measuring means and said desired frequency sweep information, and classifying said amplitude probability distribution into a group of bands having a plurality of ranges corresponding to said histogram group; and display means for displaying said bands having said ranges calculated by said arithmetic means as an area for display in different states;

wherein said histogram measuring means includes a memory having a plurality of said output codes as addresses produced from said sampling means, and a counter having a counting circuit for incrementing contents of said memory each time of appearance of data; and wherein said counter includes: (i) a counting circuit of linear feedback type having an n-stage shift register circuit for receiving clock signals to be counted, and an exclusive OR circuit for feeding back an exclusive OR of a plurality of n-bit output data of said n-stage shift register circuit to said n-stage shift register circuit for shifting the n-bit output data in step each time said clock signals are received, (ii) a latch circuit for latching data output from said counting circuit, and (iii) data conversion means for converting the data latched by said latch circuit into data indicating a number of times the output data of said counting circuit are shifted in step.

7. A spectrum analyzer according to claim 6, wherein said latch circuit includes a shift register circuit having a number of stages corresponding to a number of bits of the output data of said counting circuits in order to produce the latched output data of the counting circuits serially, and wherein the serial data output from said latch circuit are converted into parallel data and input to said data conversion circuit.

8. A spectrum analyzer according to claim 7, wherein the shift register circuit of said counting circuits includes a plurality of multiplexers for selectively applying at least an output of a flip-flop or an output of a flip-flop in a front stage to each data terminal of a plurality of said flip-flops constituting a shift register, and wherein said shift register circuit of said latch circuit includes a plurality of multiplexers for selectively applying an output of a flip-flop, an output of a flip-flop in a front stage or an output of a flip-flop of said counting circuit to each data terminal of a plurality of the flip-flops constituting a shift register.

9. A spectrum analyzer comprising:

signal receiving and processing means for receiving an input signal in accordance with desired frequency sweep information;

sampling means for sampling an output signal output from said signal receiving and processing means in accordance with a plurality of threshold values and outputting a plurality of output codes corresponding to sample values of an envelope of said input signal;

histogram measuring means for measuring a group of histograms corresponding to said output codes output from said sampling means;

arithmetic means for calculating an amplitude probability distribution of said output signal based on said histogram group measured by said histogram measuring means and said desired frequency sweep information, and classifying said amplitude probability distribution into a group of bands having a plurality of ranges corresponding to said histogram group; and display means for displaying said bands having said ranges calculated by said arithmetic means as an area for display in different states;

wherein said histogram measuring means includes a memory having a plurality of said output codes as addresses produced by said sampling means, and a counter having a counting circuit for incrementing contents of said memory each time data appears; and wherein said counter includes: (i) a plurality of ni-stage shift register circuits for receiving clock signals to be counted, corresponding to a plurality of values (n1, n2, . . . nr), respectively, at which values ($2^{ni}-1$) equivalent to the power of 2 less 1 are unique to each other, and an exclusive OR circuit for feeding back an exclusive OR of a plurality of ni-bit output data of said ni-stage shift register circuit to said ni-stage shift register circuit, the output data of n1, n2, . . . , nr bits being shifted in step each time said clock signals are received, (ii) a latch circuit for latching each output data of a plurality of said counting circuits, (iii) data conversion means for converting the data latched by said latch circuit into data indicating a number of times each of said output data of said counting circuits is shifted in step, and (iv) count calculation means for calculating a number of clock signals input to said counting circuits based on each conversion data output from said data conversion means.

10. A spectrum analyzer according to claim 9, wherein said latch circuit includes a shift register circuit having a number of stages corresponding to a number of bits of the output data of said counting circuits in order to produce the latched output data of the counting circuits serially, and wherein the serial data output from said latch circuit are converted into parallel data and input to said data conversion circuit.

11. A spectrum analyzer according to claim 10, wherein said shift register circuit of said counting circuit includes a plurality of multiplexers for selectively applying at least an output of a flip-flop or an output of a flip-flop in a front stage to each data terminal of a plurality of said flip-flops constituting a shift register, and wherein said shift register circuit of said latch circuit includes a plurality of multiplexers for selectively applying an output of a flip-flop, an output of a flip-flop in a front stage or an output of a flip-flop of said counting circuit to each data terminal of a plurality of the flip-flops constituting a shift register.

12. An amplitude probability distribution display method comprising:

receiving an input signal in accordance with the desired frequency sweep information;

producing a plurality of output codes corresponding to sample values of an envelope of said input signal by sampling an output signal based on said input signal according to a plurality of threshold values;

measuring a group of histograms corresponding to a plurality of said output codes;

calculating an amplitude probability distribution of said output signal based on said histogram group and said desired frequency sweep information and classifying the amplitude probability distribution into a group of bands having a plurality of ranges corresponding to said histogram group;

calculating desired values of said amplitude probability distribution for intensifying a contour thereof; and displaying said band group having the plurality of said ranges as an area in different states and intensifying the contour of the desired values of the amplitude probability distribution.

13. An amplitude probability distribution display method comprising:

receiving an input signal in accordance with the desired frequency sweep information;

producing a plurality of output codes corresponding to sample values of an envelope of said input signal by sampling an output signal based on said input signal according to a plurality of threshold values;

measuring a group of histograms corresponding to a plurality of said output codes;

calculating an amplitude probability distribution of said output signal based on said histogram group and said desired frequency sweep information and classifying the amplitude probability distribution into a group of bands having a plurality of ranges corresponding to said histogram group;

calculating a functional scale of said amplitude probability distribution in such a manner that, when said input signal is thermal noise according to a Rayleigh distribution, points corresponding to components of the thermal noise are plotted in line, and interpolating intermediate points between said plotted points; and displaying said band group having the plurality of the ranges as an area in different states and the functional scale of the band group having the plurality of the ranges, and further displaying a functional scale graph on which the points corresponding to the components of the thermal noise are plotted in line with a horizontal axis of the graph representing time ratios and a vertical axis representing amplitudes.

14. The display method according to claim 13, further comprising:

calibrating a plurality of said threshold values for said sampling.

15. The display method according to claim 13, further comprising:

accumulating and averaging said amplitude probability distribution.

16. The display method according to claim 13, wherein said band group having the plurality of said ranges is displayed in different color bands.

* * * * *